United States Patent
Nguyen

(10) Patent No.: US 6,195,593 B1
(45) Date of Patent: Feb. 27, 2001

(54) REUSABLE MODULES FOR COMPLEX INTEGRATED CIRCUIT DEVICES

(75) Inventor: Son Ngoc Nguyen, San Jose, CA (US)

(73) Assignee: Seiko Epson Corporation, Tokyo (JP)

(*) Notice: Subject to any disclaimer, the term of this patent is extended or adjusted under 35 U.S.C. 154(b) by 0 days.

(21) Appl. No.: 09/121,028

(22) Filed: Jul. 22, 1998

Related U.S. Application Data

(60) Provisional application No. 60/056,276, filed on Sep. 3, 1997.

(51) Int. Cl.[7] ................................................ G06F 19/00
(52) U.S. Cl. ............................ 700/97; 700/98; 700/121; 710/9; 710/22; 710/105; 710/119; 716/1; 716/5; 716/11; 716/19
(58) Field of Search ........................... 716/1, 5, 11, 17, 716/19; 700/97, 98, 121; 710/9, 10, 22, 105, 108, 119; 709/250, 251

(56) References Cited

U.S. PATENT DOCUMENTS

| | | | |
|---|---|---|---|
| 4,821,180 | 4/1989 | Gerety et al. | 710/22 |
| 5,111,423 | 5/1992 | Kopec, Jr. et al. | 710/9 |
| 5,197,016 * | 3/1993 | Sugimoto et al. | 716/1 |
| 5,293,384 | 3/1994 | Keeley et al. | 714/55 |
| 5,341,495 | 8/1994 | Joyce et al. | 710/105 |
| 5,450,551 | 9/1995 | Amini et al. | 710/119 |
| 5,471,638 * | 11/1995 | Keeley | 710/7 |
| 5,533,204 | 7/1996 | Tipley | 710/108 |
| 5,537,607 | 7/1996 | Ploger, III | 710/10 |
| 5,619,651 | 4/1997 | Young | 709/250 |
| 5,822,550 * | 10/1998 | Milhaupt et al. | 710/126 |
| 5,926,420 * | 7/1999 | Kim | 364/189.02 |

FOREIGN PATENT DOCUMENTS

| | | |
|---|---|---|
| 0 605 971 | 7/1994 | (EP) . |
| 0 685 803 | 12/1995 | (EP) . |
| WO 95/31778 | 11/1995 | (WO) . |

OTHER PUBLICATIONS

Textbook: Verilog HDLA A Guide to Digital Design and Synthesis; Samir Palnitkar "Overview of Digital Design with Verilog HDL"; pp. 3–9; 1996.

* cited by examiner

Primary Examiner—William Grant
Assistant Examiner—Ramesh Patel

(57) ABSTRACT

The design of an integrated circuit device is simplified by employing reusable modules to avoid or reduce the need to design special purpose glue logic otherwise needed to interconnect the modules. Functional modules comprise interface circuits that are interconnected by buses and operate according to prescribed bus-access protocols. In a preferred embodiments, bus access is arbitrated in an adaptive manner that may be controlled by a principal module in the device. In other embodiments, bus arbitration is not required. The operation of each functional module may be programmed under the control of the principal module.

34 Claims, 18 Drawing Sheets

| MODULE 8 | 224 - 255 |
| --- | --- |
| MODULE 7 | 192 - 223 |
| MODULE 6 | 160 - 191 |
| MODULE 5 | 128 - 159 |
| MODULE 4 | 96 - 127 |
| MODULE 3 | 64 - 95 |
| MODULE 2 | 32 - 63 |
| MODULE 1 | 0 -31 |

| B31 | B30 | B29 | B28 |
| --- | --- | --- | --- |
| B27 | B26 | B25 | B24 |
| B23 | B22 | B21 | B20 |
| B19 | B18 | B17 | B16 |
| B15 | B14 | B13 | B12 |
| B11 | B10 | B9 | B8 |
| B7 | B6 | B5 | B4 |
| B3 | B2 | B1 | B0 |

| BYTE 3 | BYTE 2 | BYTE 1 | BYTE 0 | ~ 21 |
| --- | --- | --- | --- | --- |
| BYTE 0 | BYTE 1 | BYTE 2 | BYTE 3 | ~ 22 |

| 1 1 1 0 | ~ 23 |
| --- | --- |
| 1 1 0 1 | ~ 24 |
| 1 0 1 1 | ~ 25 |
| 0 1 1 1 | ~ 26 |
| 1 1 0 0 | ~ 27 |
| 0 0 1 1 | ~ 28 |
| 0 0 0 0 | ~ 29 |

| DMA Type | Module Type | Module Number |
|---|---|---|
| b7    b6 | b5              b3 | b2            b0 |

| Tgt ID 6 | Tgt ID 5 | Tgt ID 4 | Tgt ID 3 | Tgt ID 2 | Tgt ID 1 |
|---|---|---|---|---|---|
| b31   b28 | b24 | b20 | b16 | b12 | b8 |

| FLUSH4 | FLUSH3 | FLUSH2 | FLUSH1 | DATAE4 | DATAE3 | DATAE2 | DATAE1 |
|---|---|---|---|---|---|---|---|
| b7 | b6 | b5 | b4 | b3 | b2 | b1 | b0 |

| ENINT4 | ENINT3 | ENINT2 | ENINT1 | SWRST4 | SWRST3 | SWRST2 | SWRST1 |
|---|---|---|---|---|---|---|---|
| b7 | b6 | b5 | b4 | b3 | b2 | b1 | b0 |

REUSABLE MODULES FOR COMPLEX INTEGRATED CIRCUIT DEVICES

CROSS-REFERENCE TO RELATED APPLICATION

This application claims benefit of priority of prior filed copending U.S. provisional application Ser. No. 60/056,276, filed Sep. 3, 1997, which is incorporated by reference in its entirety.

TECHNICAL FIELD

The present invention generally pertains to integrated circuits and integrated circuit design processes. The present invention pertains more particularly to integrated circuit design processes and integrated circuits that employ reusable modules to reduce time and costs required for design and implementation.

BACKGROUND ART

Integrated circuit design processes have evolved quickly to keep pace with the rapid growth in integrated circuit (IC) complexity. Early IC devices, known as Small Scale Integration chips, had relatively few logic gates. Later, as IC technology advanced, it became possible to implement Medium Scale Integration chips with hundreds of logic gates. With the arrival of Large Scale Integration, thousands of logic gates could be implemented on a single chip.

As IC complexity increased, IC design became more complicated and increasing interest was shown in automated processes that could assist chip designers with design and implementation activities. Electronic Design Automation (EDA) tools were developed and these tools have continued to evolve with the arrival of Very Large Scale Integration (VLSI), which initially allowed single chips to carry hundreds of thousands of transistors.

Present EDA tools permit a chip designer to specify a chip in abstract, functional terms using a Hardware Description Language (HDL), translate the HDL design description into a gate-level description, layout the placement of gates and route connecting paths, and generate a mask for chip fabrication. Two examples of HDL include Verilogo® HDL, developed by Gateway Design Automation, and VHSIC HDL (VHDL), developed under contract from the U.S. Dept. of Defense.

Throughout the remainder of this disclosure, VHDL and especially Verilog HDL are discussed but no other description language is mentioned. It should be understood that many of the concepts discussed herein, particularly those of the present invention, are not limited to these two languages but instead are applicable to a wide range of languages.

Verilog HDL allows a designer to specify a chip in terms of modules that are described at any or all of four levels of abstraction: functional or algorithmic (behavioral-level), flow of data (dataflow-level), gates and interconnections (gate-level), or switches, storage nodes and connections between them (switch-level). The behavioral level is the most abstract level and is independent of device implementation details. The switch level is the least abstract and is very dependent on device implementation details. Modules are generally hierarchical, meaning that higher-level, more complex modules incorporate one or more lower-level, less complex modules. At some level, a module usually represents some component such as a storage register, a multiplexor or a UART (Universal Asynchronous Receiver/Transmitter).

A number of EDA tools for Verilog HDL and VHDL have automated a number of design steps including functional simulation and logic synthesis. Manual intervention is required, however, to manage the overall process, verify functional design, and ensure design requirements are achieved. Considerable manual effort is required to design chips that must meet stringent requirements such as high speed operation, small die size, wide temperature ranges, or low power requirements. Chips for microprocessors and random access memory (RAM) usually must be designed manually to achieve optimal performance because the automated tools are not yet good enough. This is particularly true for submicron technologies because layout decisions can dominate timing characteristics.

Further advances in VLSI technology permit fabrication of chips with millions of transistors. Circuits of such complexity can implement complete systems that formerly were implemented on a main board and one or more ancillary boards. So called System-on-a-chip (SOC) devices and other complex devices often integrate proprietary modules from different vendors that do not adhere to any particular interface standard; therefore, "oglue logic" or interface circuitry must be designed manually to interconnect these proprietary modules. The time and effort required to design and implement this glue logic increases the time and the cost required to design and implement a chip.

DISCLOSURE OF INVENTION

It is an object of the present invention to eliminate or at least reduce the manual effort required to design special interface circuitry interconnecting modules in an integrated circuit. This object is achieved by practicing the techniques of the present invention that allow a hardware designer to reuse pre-designed modules without the need to implement special-purpose glue logic.

According to the techniques of one aspect of the present invention, an integrated circuit device comprises a plurality of electrical connections accessible outside the device; a bus comprising a plurality of conductive paths internal to the device; a first module having a first interface circuit connected to the bus that operates according to a bus-access protocol, a first data path circuit coupled to the first interface circuit, one or more first registers coupled to the first interface circuit, a first state machine coupled to one of the first registers and coupled to the first data path circuit so as to control the first data path circuit, and a first external interface circuit coupled to the first data path circuit and coupled to one or more of the electrical connections; and one or more second modules internal to the device, wherein each second module has a respective second interface circuit connected to the bus that operates according to the bus-access protocol, a respective second data path circuit coupled to the respective second interface circuit, one or more respective second registers coupled to the respective second interface circuit, and a respective second state machine coupled to one of the respective second registers and coupled to the respective second data path circuit so as to control the respective second data path circuit.

According to the techniques of another aspect of the present invention, a method for designing an integrated circuit device that includes a bus internal to the device comprises the steps of generating a first description of the device using hardware description language, the first description describing one or more modules each having a bus interface internal to the electronic device that couples to the bus and conforms to a bus access protocol; obtaining a third description of the device by combining the first description with one or more second descriptions, each of the second descriptions describing one or more modules each having a bus interface internal to the device that couples to the bus and conforms to the bus access protocol; specifying-design constraints and choice of implementation technology for the device; and generating the technology-dependent design specification by synthesizing the third description according to the design constraints and the choice of implementation technology.

According to the techniques of yet another aspect of the present invention, a medium readable by a machine conveys a program of instructions for interpretation by the machine to generate a technology-dependent design specification for an electronic device. The program of instructions describes the electronic device as comprising a bus comprising a plurality of conductive paths internal to the device; a first module that has a first bus interface circuit coupled to the bus that operates according to a bus-access protocol, a first data path circuit coupled to the first bus interface circuit, one or more first registers coupled to the first bus interface circuit, a first state machine coupled to one of the first registers and coupled to the first data path circuit so as to control the first data path circuit, and a first external interface circuit coupled to the first data path circuit and coupled to one or more of electrical connections external to the device; and one or more second modules each having a respective second bus interface circuit coupled to the bus that operates according to the bus-access protocol, a respective second data path circuit coupled to the respective second bus interface circuit, one or more respective second registers coupled to the respective second bus interface circuit, and a respective second state machine coupled to one of the respective second registers and coupled to the respective second data path circuit so as to control the respective second data path circuit.

The various features of the present invention and its preferred embodiments may be better understood by referring to the following discussion and the accompanying drawings in which like reference numerals refer to like elements in the several figures. The contents of the following discussion and the drawings are set forth as examples only and should not be understood to represent limitations upon the scope of the present invention.

MODES FOR CARRYING OUT THE INVENTION

A. IC Device Design

1. Overview of the Design Process

Figure 1:
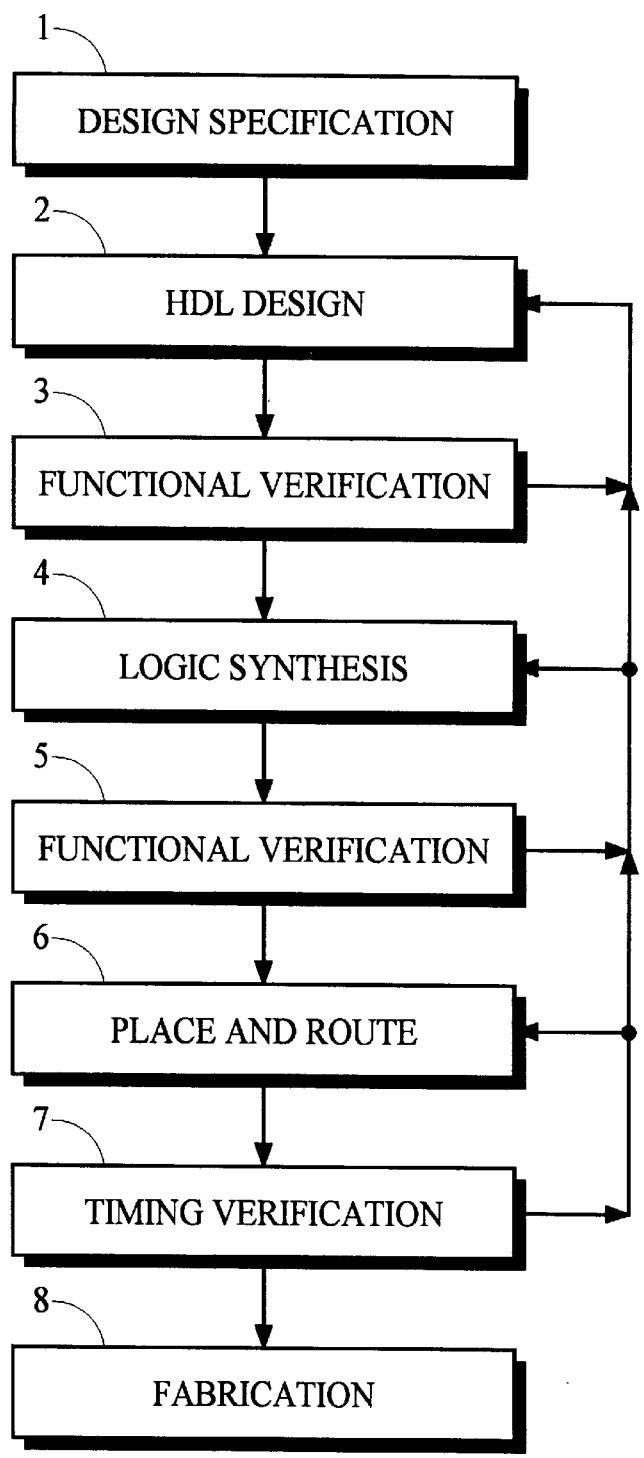
FIG. 1 is a high-level flow diagram of a processes for designing and fabricating an integrated circuit device.

FIG. 1 is a high-level flow diagram of major activities in one process for designing and fabricating an integrated circuit (IC) device. Although the following description omits many details in this process, it provides sufficient information for understanding how the present invention may be applied in such processes.

In step 1, designers develop a specification for the desired IC device that includes items such as the functions to be performed, timing constraints, operating temperature range, and maximum size of the die or substrate on which the IC is to be fabricated.

In step 2, using a hardware description language (HDL) such as Verilog HDL or VHDL, designers can express the IC device in functional terms that are more or less independent of device implementation details. Many HDL can also be used to specify test signals or test vectors to test the HDL design. The HDL is generally recorded on a Machine readable medium such as magnetic disk or tape; however, essentially any medium may be used to convey the HDL expression including optical media and transmission by some form of electromagnetic radiation.

In step 3, designers verify the correctness of the HDL expression. This is often accomplished by using test vectors to exercise the HDL expression in a simulator and then comparing waveforms obtained from the simulation with desired waveforms. If the simulation results are not acceptable, the designer returns to step 2 to change the HDL expression and then performs functional verification again.

When the functional verification in step 3 is successful, the design process continues with step 4 in which the HDL expression is translated by a logic synthesis tool into a technology-dependent expression of the device, referred to herein as a "pre-layout gate-level netlist." Logic synthesis takes into account various design constraints such as timing requirements, operating temperature range, power limitations, and die size, and it also takes into account the choice of technology. The choice of technology implies a set of primitives and macros, sometimes referred to as a cell library, that represents how logic synthesis translates abstract HDL expressions into elements of the technology-dependent gate-level netlist.

Of particular significance to the present invention, logic may be synthesized from a combination of newly designed and pre-existing HDL entities referred to as "modules." For example, modules that have been developed according to the techniques of the present invention may be stored in a library and retrieved to be easily combined in various ways to design new IC devices. Various embodiments of modules that facilitate reuse is described below in more detail.

In step 5, a functional verification of the gate-level netlist is performed. If the verification is not successful, the process may return to step 4 in which, for example, some design constraints may be changed, or the process may return to step 2 in which the HDL expression can be changed.

When the functional verification in step 5 is successful, the design process continues with step 6 in which the pre-layout gate-level net list is processed to derive a physical description, referred to here as a "post-layout gate-level netlist," which specifies how gates or cells are arranged and conductive paths or wires are routed.

In step 7, simulations of the post-layout gate-level netlist are used to verify the functional design of the IC device including timing requirements. Timing verification of high-performance devices cannot be completed until after layout is performed because layout decisions can dominate timing characteristics. This is particularly true for submicron technologies. If timing verification is not successful, the process may return to step 6 to change various place and route decisions, or it may return to step 4 or step 2 as explained above.

2. Features

The present invention facilitates the IC device design process by reducing or eliminating the need to design "glue logic" to interconnect various modules within a device. This is particularly attractive in device designs that include previously designed modules, such as vendor-supplied proprietary modules, that do not adhere to any one particular interface standard. For example, a proprietary module for a Video Graphics Array (VGA) adaptor from one vendor may impose one set of interface requirements and another proprietary module for video random access memory (VRAM) from another vendor may impose a different interface requirement. According to current design methods, special-purpose circuits or "glue logic" must be designed to connect these two modules. The need to design glue logic increases the time and the cost required to design and fabricate a new IC device.

The present invention provides modular, reusable modules that can be easily combined in the designs of new devices and can be easily ported from one choice of device technology to another. Although the techniques of the present invention can be applied to realize a wide range of design criteria, embodiments disclosed herein provide the following features: high-performance synchronous buses that can provide multiple simultaneous direct-data transfers in any of several modes, programmable modules, intelligent bus arbitration for shared buses or multiplexed access to buses with arbitration, module-to-module connections that operate without arbitration, and simultaneous data transfers on one bus from one source to as many as two destinations.

B. Structure of Device

1. Overview of Device

Figure 2:
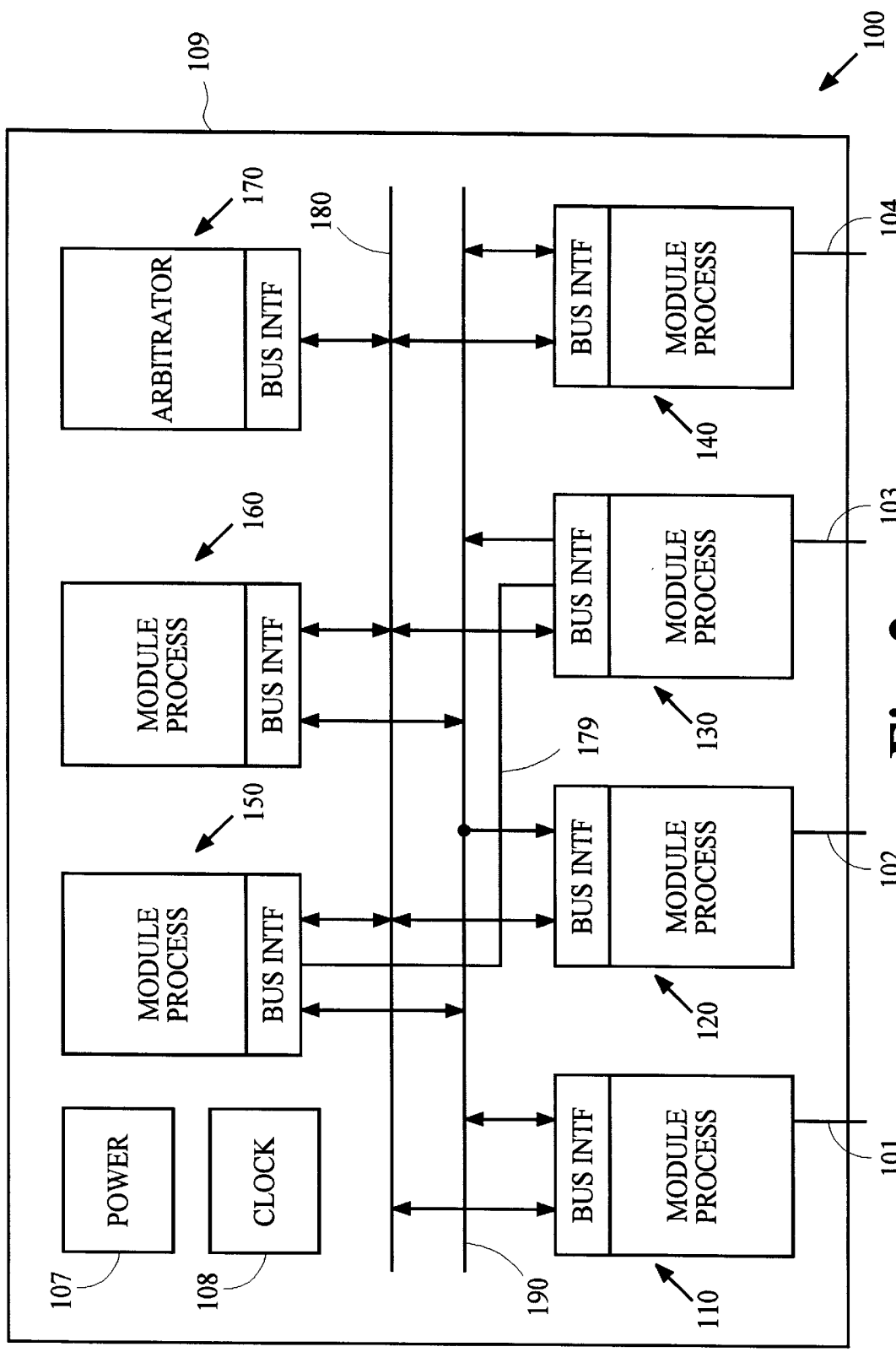
FIG. 2 is a schematic diagram of one embodiment of an integrated circuit device that comprises a plurality of modules coupled to internal buses.

FIG. 2 is a schematic diagram of one embodiment of an IC device according to various aspects of the present invention. This embodiment of IC device 100 includes six modules 110 through 160 that are coupled to input/output (I/O) bus 180 and data bus 190, and data-bus arbitrator 170 that is coupled to I/O bus 180. An overview and a detailed discussion of the modules is provided below.

I/O bus 180 is used to program modules and to obtain status of the modules. A module may be programmed by writing information into one or more registers or storage areas within that module. Status for a module may be obtained by reading information from one or more of registers in the module. Requests for status may originate in response to interrupts or routine polls.

I/O bus 180 may be implemented in a variety of ways. A few embodiments are mentioned here. In a first embodiment, one I/O bus is used to carry both addresses and data for I/O write operations and I/O read operations. I/O write operations are used for programming modules by writing data into module registers and I/O read operations are used for obtaining module status by reading information from module registers. The addresses carried by the I/O bus specify the location into which data is to be written (write operations) or out of which data is to be read (read operations). In a second embodiment, the I/O bus is divided into separate I/O data and I/O address buses. The I/O data bus carries information that is to be written into module registers (write operations) or has been read from module registers (read operations) and the I/O address bus carries the address of the location for the read and write operations. In a third embodiment, the I/O bus is divided into three buses: a write-data bus, a read-data bus, and a shared address bus. Further embodiments may be realized by modifying the second or third embodiments to include multiple I/O data buses. Embodiments such as these represent a tradeoff between IC device complexity and performance. No particular embodiment is critical to the practice of the present invention.

Data bus 190 is used to transfer data to and from the modules. In principle, essentially any protocol for data transfer may be used. Each module may be viewed as a processor of data and/or a port through which data passes to and from other devices that are not part of IC device 100. Data bus 190 may also be implemented in a variety of ways including, for example, multiple data buses.

The width and number of buses are scalable, which means that an IC device according to the present invention may have any practical number of buses of any practical width. In principle, the I/O bus and the data bus may be implemented by a single bus; however, this embodiment is generally not preferred because contention between bus signals for module programming, module status and data transfers would degrade overall device performance.

Each module that connects to the buses includes bus interface circuitry that operates according to specified protocols. In the embodiment shown, the bus interface for each module includes an I/O bus interface circuit coupled to I/O bus 180 that operates according to an I/O-bus-access protocol. The bus interface for modules 110 through 160 include a data bus interface circuit that couples to data bus 190 and operates according to a data-bus-access protocol. Specific protocols are described in more detail below; however, the present invention is not restricted to any particular protocols. Data bus access is controlled by arbitration module 170. A wide variety of arbitration techniques may be used without departing from the scope of the present invention. In some embodiments, bus arbitration is not necessary.

In preferred embodiments, one module is designated the principal module for IC device 100 and is responsible for functions such as: (1) driving the lines for all data and I/O buses to known states in response to one or more signals that are generated by a power-on reset, a hardware reset and/or a software reset, (2) programming other modules in IC device 100, and (3) facilitating the flow of information and control signals between modules inside IC device 100 and components external to IC device 100. Modules may be programmed by logic within the principal module.

Power management 107 and clock 108 are examples of components that may be incorporated into IC devices according to the present invention. Power management 107 represents components that allow an IC device to control power consumption and clock 108 represents components that synthesize a clock signal. These components as well as other components may be important for particular applications but they do not form part of the present invention and they are not critical to the practice of the present invention.

Throughout this specification, reference is made to various components that are either internal or external to an IC device. Boundary 109 represents the demarcation between locations that are considered to be either external or internal to the device. In one embodiment, this demarcation is the edge of a die or substrate on which circuitry for the IC device is fabricated. In another embodiment, the demarcation is an enclosure such as the hermetically sealed enclosure for a conventional IC package.

2. Overview of Modules a. Basic Configuration

Figure 3B:
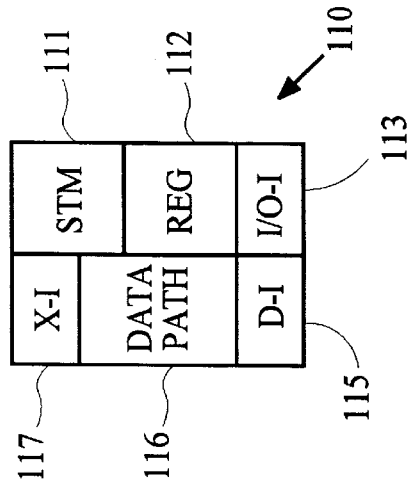
FIGS. 3A, 3B, 3C and 3D are schematic illustrations of several embodiments of modules for use in integrated circuit devices.
Figure 3D:
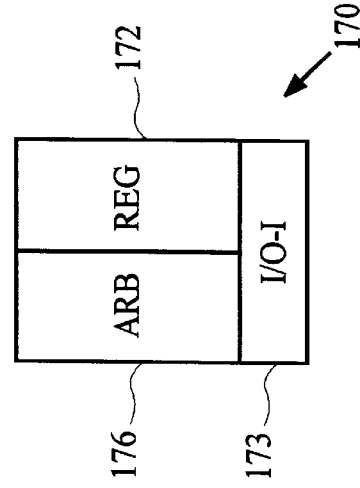
Figure 3A:
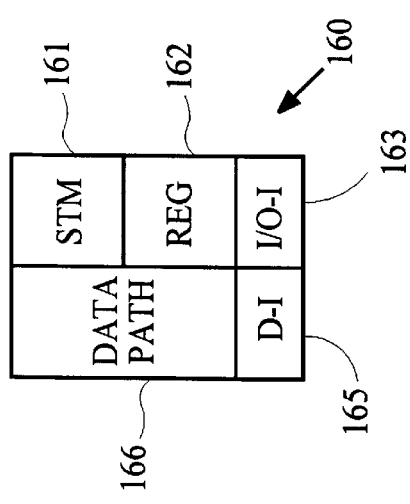

FIG. 3A schematically illustrates module components in a basic configuration. As shown, module 160 includes circuitry that implements state machine 161, one or more registers 162, I/O interface 163, data interface 165 and data path 166. In preferred embodiments, modules initialize themselves into one or more known states in response to one or more signals that are generated by a power-on reset, a hardware reset and/or a software reset.

(1) Data Interface

Data interface 165 couples to data bus 190 and operates according to a specified data-bus-access protocol. It is coupled to data path 166 and provides the ability to send data to and/or receive information from data path 166. In preferred embodiments, each data interface may provide as may as two input channels and as many as two output channels. A module is assigned a "type" according to the numbers and types of channels as follows:

TABLE I

| Module Type | Input Channels | Output Channels |
|---|---|---|
| 0 | 2 | 2 |
| 1 | 1 | 2 |
| 2 | 2 | 1 |
| 3 | 1 | 1 |
| 4 | 2 | 0 |

TABLE I-continued

| Module Type | Input Channels | Output Channels |
|---|---|---|
| 5 | 0 | 2 |
| 6 | 1 | 0 |
| 7 | 0 | 1 |

In this embodiment, the input channels are passive in that they do not generate any requests to receive data. Instead, an appropriate protocol is used to control the start of data flowing from a data source to a designated data destination through a specified input channel. In this manner, an input channel need not know the identity of the data source but need only receive and pass along any data that is sent to it. The protocol allows an input channel to indicate it is busy and therefore not available to receive data. This is described below in more detail. The output channels, on the other hand, are active in that a data source generates a request for sending data to a specified destination. As mentioned above, an appropriate protocol is used to control the start of data flow.

Essentially any technology may be used to implement the connection of the data interface to the data bus. For example, tri-state logic may be used to connect multiple channels to a given data bus.

In preferred embodiments, data interface circuits for modules that have both input and output channels include "loop back" circuits between the input and output channels. These loop back circuits may be used for testing or any other desired purpose. In a type 0 module (see Table I), for example, each of the two input channels could be connected to a respective one of the two output channels. In a type 1 module, the one input channel could be connected to either one of the two output channels.

(2) Data Path

Data path 166 allows data to flow from one or more sources to one or more destinations and may implement any of a number of functions such as a first-in-first-out (FIFO) buffer or a last-in-first-out (LIFO) buffer, single-or multi-port RAM, a data format converter, a multiplexor, or essentially any form of data processing. The function of data path 166 depends on the specific application served by the module. No particular function is critical to the practice of the present invention.

For module 160, data path 166 contains circuitry to send data through data interface 165 and may contain circuitry to receive data through data interface 165. Such receive circuitry would not be required if data path 166 operated essentially as read-only memory (ROM). Various input and output configurations are discussed below.

(3) I/O Interface

I/O interface 163 couples to I/O bus 180 and operates according to a specified I/O-bus-access protocol. It is coupled to registers 162 and provides the ability to write information to and/or read information from one or more of these registers. Essentially any technology may be used to implement the connection of the I/O interface to the I/O bus. For example, tri-state logic may be used to allow multiple interfaces to share a particular I/O bus.

Tri-state implementations are attractive because they result in a smaller die for the IC device but they are generally not preferred because, in view of current EDA tools and techniques, much greater skill is required on the part of the designer to achieve reliable implementations. Furthermore, an HDL design that achieves a reliable implementation using one vendor technology may not achieve a reliable implementation using another vendor technology.

These difficulties are greater if I/O read and I/O write operations share the same bus. For example, if noisy I/O bus signals result in address decoding errors that cause two modules to drive signals onto an I/O bus simultaneously, excessively high currents through bus interface circuitry could cause premature IC device failure. This problem can be reduced by using module-select lines in addition to unique address ranges for each module, described below.

All of these problem can be avoided entirely, however, by multiplexing multiple I/O read buses. In preferred embodiments, the I/O bus is divided into an I/O write bus and multiple I/O read buses. Tri-state logic for I/O read bus interface circuits is avoided by multiplexing the multiple I/O read buses. This is explained in more detail below.

Module-select lines may also be used with multiplexed multiple I/O read buses. In such embodiments, the signals on the module-select lines may be used to shut down unneeded circuits, thereby conserving power, and/or they can be used to indicate when signals on the I/O bus represent valid information. For example, an appropriate signal can be asserted on a respective module-select line when the signals on the lines of the I/O write bus have settled and represent valid data and/or addresses.

(4) Registers

Registers 162 store information that is used to identify, configure, control and/or monitor the module. This is described more fully below. In preferred embodiments, status information stored in registers 162 by state machine 161 is automatically cleared after an I/O read is performed.

Essentially any technology may be used to implement the connection between the I/O interface and the registers. In preferred embodiments, the registers are accessed by mapped I/O. Modules may map their respective registers either into unique ranges of addresses or into a common address space. The interval between adjacent addressable locations may be any convenient data length such as one byte, two bytes ("half words"), or four bytes ("words"). The size of the address space may be any convenient size but it is generally limited by the width of the I/O bus path that carries addresses. For example, an 8-wire I/O address bus can conveniently specify $2^8$ or 256 locations. A 8-wire bus could specify more locations by splitting each address into multiple time-multiplexed portions; however, these techniques are not attractive because they requires complex decoding logic and they adversely affect I/O bus performance.

If the address space is shared by multiple modules, the module must be identified or selected to unambiguously define the register location. This may be accomplished in any of several ways. One way is to have the I/O-bus-access protocol require I/O read and I/O write requests to provide a module identifier in addition to the address. Another way is to provide each module with a unique module-select line and then select the intended module by asserting the appropriate logic level on the proper line. All modules could "see" the addresses passed along the I/O bus but only the selected module would respond.

Figures 4A, 4B, 4C, 4D:
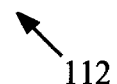
FIGS. 4A, 4B, 4C and 4D are tables of hypothetical information including address allocations for registers of modules for use in integrated circuit devices.

If the address space is divided into unique ranges for each module, then the address itself identifies the module, the register and the location within the register. FIG. 4A illustrates one way in which eight modules may map their respective registers into unique ranges of addresses. The beginning address for each module is the "base address" for that module. According to the example illustrated in the figure, each module is allocated a unique space of thirty-two addressable locations. Essentially any amount of space can be allocated to each respective module; however, a space that represents a number of addressable locations that is a power-of-two is generally preferred because it simplifies the address decoding logic for each module. In the embodiment described below, each addressable location corresponds to one byte or eight binary-bits of storage. The total address space is constrained to 256 addressable locations. As explained above, the address space may be essentially any size.

According to the example shown in the figure, the address for location 100 falls within the range of addresses for module 4. Because the base address for this module is 96, location 100 corresponds to the fifth location in the registers for module 4. It should be appreciated that other divisions of the total address space may be used and that no particular division is critical to practice the present invention. Referring to FIG. 4B, which represents information stored in the so called "Little Endian" format, the fifth location corresponds to the cell labeled B4.

Referring to FIG. 4C, row 21 illustrates data stored in the Little Endian format. Conversely, row 22 illustrates data stored in the so called "Big Endian" format. Registers and data paths may store information in either format, or in essentially any other format, without departing from the scope of the present invention.

(5) State Machine

State machine 161 couples to registers 162 and is used to control data path 166. Registers 162 can provide working storage for state machine 161, can provide parameters to program the operation of state machine 161, and can store information indicating the status of state machine 161 or the status of data path processing. Just as for data path 166, the design of state machine 161 depends on the specific application served by the module. No particular function is critical to the practice of the present invention.

(6) Design Considerations

It is anticipated that the design and layout of components such as state machine 161, registers 162 or data path 166 can be optimized more easily if each component is specified in a separate HDL file.

b. Configuration with External Interface

FIG. 3B is a schematic illustration of module components according to a first alternative configuration. As shown for module 110, the first alternative configuration includes circuitry implementing all the components of the basic configuration. The discussion of this basic configuration also applies to the first alternative configuration.

External interface 117 couples to connections that are accessible from outside IC device 100 and provides the ability to send signals to and/or receive signals from an external device. External interface 117 conforms to whatever signal level and signaling protocol is required to communication with the external device.

In an embodiment discussed below, external interface 117 of the principal module is assumed to interface with a computer bus such as a Peripheral Component Interconnect (PCI) local bus. The design of the external interface is dependent on the application and includes essentially any type of connection such as interfaces to Industry Standard Architecture (ISA) buses, access to Synchronous Dynamic RAM (SDRAM), output to Video Graphics Array (VGA) display devices, and communication along Universal Serial Bus (USB) and IEEE 1394 links.

The discussion of data path 166 generally applies to data path 116 except that, in certain embodiments, data path 116 may contain circuitry that only receives data through data interface 115 and passes that data on to external interface 117.

c. Configuration with User Interface

Figure 3C:
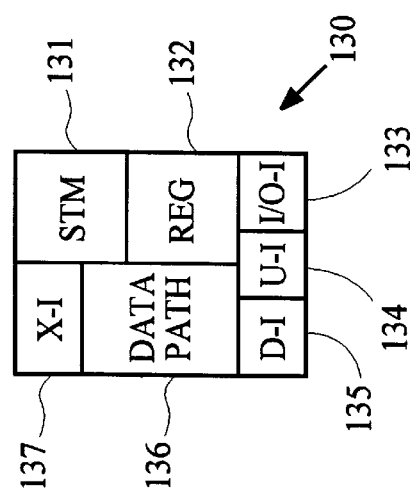

FIG. 3C is a schematic illustration of module components according to a second alternative configuration. As shown for module 130, the second alternative configuration includes circuitry implementing all the components of the first alternative configuration. The discussion of the first alternative configuration also applies to the second alternative configuration.

User interface 134 couples to a direct connection with another module. This interface conforms to whatever signal level and signaling protocol is required to communication with the other module. It is anticipated that the user interface and/or the data path includes a state machine to perform whatever processing is required to carry out module-to-module communication.

A third alternative configuration that includes a user interface but does not include an external interface is also possible. This third alternative configuration is not illustrated in any form and is not included in any of the examples discussed below.

d. Data Bus Arbitration Module

FIG. 3D is a schematic illustration of one embodiment of a data-bus-access arbitration module. As shown, arbitration module 170 includes circuitry implementing one or more registers 172, I/O interface 173 and arbitration state machine 176. In preferred embodiments, arbitration module 170 clears its registers and initializes itself into one or more known states in response to one or more reset signals in a manner similar to that described above for other modules.

(1) I/O Interface

I/O interface 173 couples to I/O bus 180 and operates according to a specified 110-bus-access protocol. It is coupled to registers 172 and provides the ability to write information into and/or read information from one or more of these registers. Essentially any technology may be used to implement the connection of the I/O interface to the I/O bus, as explained above for other modules.

(2) Registers

Registers 172 store information that is used to identify, configure, control or monitor the arbitration module. In preferred embodiments, status information stored in registers is automatically cleared after an I/O read is performed.

Essentially any technology may be used to implement the connection between the I/O interface and the registers, as discussed above for other modules. For example, in embodiments that map a respective module's registers into a unique range of addresses, arbitration module registers could be mapped into an unused address range such as the range for module 8 shown in FIG. 4A. The interval between adjacent addressable locations can be any convenient data length, as discussed above. No particular addressing scheme is critical to the practice of the present invention.

(3) Arbitration State Machine

Data-bus arbitration module 170 may use essentially any arbitration technique such as by module priority or by a round-robin sequence. The module may be designed to adaptively select the most appropriate arbitration method and/or it may be programmable through its registers. In preferred embodiments, arbitration module 170 is implemented according to a specific design tailored for a particular IC device rather than implemented according to a generic design that could be used in a wide range of devices. Generic designs are not preferred because they are generally large and slow.

C. Preferred Embodiment

A detailed description of a preferred embodiment and a few variations of this preferred embodiment will now be presented to more clearly describe various aspects of the present invention. This embodiment and the variations are only a few examples of how the present invention may be carried out. Furthermore, it should be appreciated that various features of the embodiments disclosed herein are independent of one another and may be practiced in any useful combination.

According to the preferred embodiment, an IC device includes multiple internal buses. Direct-data transfers are controlled by arbitration and may be carried out in any of four transfer modes on as many as four 32-bit data buses. The I/O bus is divided into an I/O write-data bus, an I/O read-data bus and an I/O address bus. In one variation, four distinct I/O read-data buses are used. Direct connections between any pair of modules may be achieved through user interface circuits coupled to two 2-bit buses.

The IC device includes a principal functional module, a data-bus arbitration module, and as many as six other functional modules. Each functional module is assigned a unique number between one and seven. The principal functional module, which is assigned the number one, is a type 0 module (2 data-input and 2 data-output channels) having an external interface that couples to a PCI bus. The principal module is responsible for driving the lines for all data and I/O buses to known states in response to a system-reset signal. As explained above, the present invention is not limited to any particular type of bus and may be practiced in systems that do not have buses.

All other functional modules may have any one of the eight combinations of data input and data output channels described above in Table I; however, bit definitions for the registers, described below, restrict the total number of data-output channels to no more than twelve and restrict the total number of data-input channels to no more than ten. Each functional module may have up to eight 4-byte registers that are mapped into unique address ranges as shown in FIG. 4A. The range for module 8 is reserved and may be used for registers in the arbitration module. As explained above, this particular embodiment is provided merely as an example.

1. Register Usage

As mentioned above, the registers for each module are mapped into a unique range of address in a common address space according to the ranges shown in FIG. 4A. The number assigned to each module governs into which address range its registers are mapped. For example, referring to FIG. 4A, the range of addresses for module 5 is from 128 through 159. The address space for each module is arranged into eight registers of four bytes each. Each register stores information in the Little Endian format as shown in FIG. 4B. Information in the registers may be accessed as individual bytes, as 2-byte half words, or as 4-byte words.

According to the preferred embodiment, the contents of the first two registers (bytes B0 through B7) are defined by a convention that is common to the functional modules. The contents of the remaining six registers (bytes B8 through B31) in each module may be defined as required by that respective module. Unused registers and any unused bits within the registers may be "hardwired" to some logic state such as a logic zero.

Figures 5A, 5B, 5C, 5D, 5E:
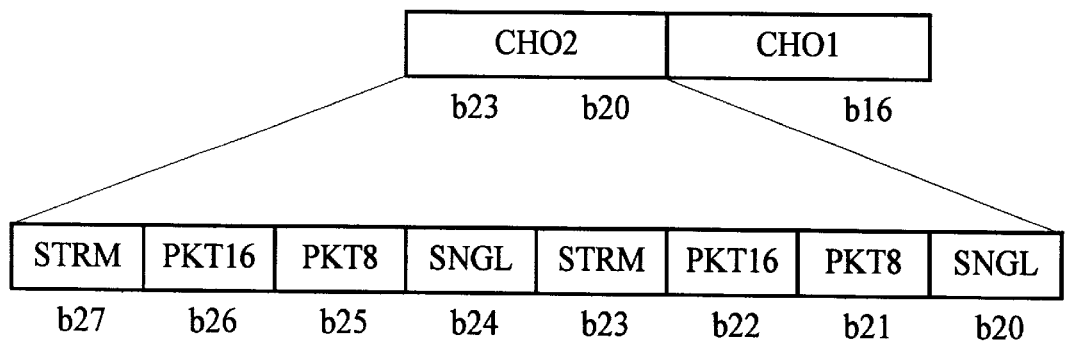
FIGS. 5A, 5B, 5C, 5D and 5E illustrate bit definitions in registers for one embodiment of a module according to the present invention.

Byte B0 is reserved for a module identifier that is unique for each module. The bits in this byte are hardwired so that they are read-only. The module identifier comprises a module number, a module type, and a direct-data-transfer type as shown in FIG. 5A.

The 3-bit module number, represented by the least-significant bits b0 to b2, is a unique number for each module that ranges from one to seven. As mentioned above, the principal module in each IC device is module 1.

The 3-bit module type, represented by bits b3 to b5, is a binary number that specifies the configuration of data input and output channels and corresponds to the decimal number for "Module Type" shown above in Table I. For example, a 3-bit value of $101_2$ specifies module type 5, which has no data input channels and two data output channels.

The 2-bit direct-data-transfer type, represented by the most-significant bits b6 and b7, specifies the type of direct-data transfers that the respective module will use when it acts as a data source. Functional modules that do not have any data-output channels, such as type 4 modules, may hardwire these bits to a logic zero. Each type of direct-data transfer is given a priority for data-bus arbitration. The bit values for direct-data-transfer type are shown in the following table.

TABLE II

| Bits | | Direct-Data- | Arbitration |
|---|---|---|---|
| b7 | b6 | Transfer Type | Priority |
| 1 | 1 | STRM | 1 |
| 1 | 0 | PKT16 | 2 |
| 0 | 1 | PKT8 | 3 |
| 0 | 0 | SNGL | 4 |

The type "STRM" transfers a variable number of bytes that is controlled by the direct-data transfer source; however, in this embodiment, the transfer is limited to 128 packets. Each packet can convey one bit for each wire in the data bus. Each packet can convey a word of 32 bits. The type "PKT16" transfers 16 packets and the type "PKT8" transfers 8 packets. The type "SNGL" transfers a single packet. The arbitration priority is discussed below.

Bytes B1 through B3 of the first register are reserved for one or more module target identifiers that will be used for direct-data transfer operations, as shown in FIG. 5B. The bits in these bytes are programmable and are set to zero when the IC device is reset. Any bits in these bytes that are not needed in particular module may be hardwired to a logic zero.

Each of these bytes contains two 4-bit target identifiers. For example, the least significant bits of byte B1, which are bits b8 to b11, represent the first target identifier. The most significant bits of byte B3, which are bits b28 to b31, represent the sixth target identifier. Unique target identifiers are assigned to respective modules after the IC device architecture is defined. According to this embodiment, each data-output channel may connect to as many as six modules in random fashion. A data-output channel may also connect to as many as two data-input channels simultaneously.

Bytes B4 through B7 in the second register are reserved for direct-data-transfer control bits. The bits in these bytes are programmable and are set to zero when the IC device is reset. Any bits in these bytes that are not needed in particular module may be hardwired to a logic zero. For example, a type 7 module has only one data output channel; therefore, bits are required for only one data channel.

The four least-significant bits in byte B4, which are bits b0 to b3 as shown in FIG. 5C, represent four DATAE# bits to activate or deactivate respective data input/output channels. The four most-significant bits in byte B4, which are bits b4 to b7, represent four FLUSH# bits to flush any remaining data in respective data channel FIFO buffers. For example, bits b0 and b4 represent DATAEI and FLUSHI, respectively, for data channel 1.

The four least-significant bits in byte B5, which are bits b8 to b11 as shown in FIG. 5D, represent four SWRST# bits to reset respective data input/output channels. The four most-significant bits, which are bits b12 to b15, represent four ENINT# bits to enable or disable interrupt requests for respective data channels. For example, bits b9 and b13 represent SWRST2 and ENINT2, respectively, for data channel 2.

Byte B6 contains two sets of four bits each that specify direct-data-transfer types for each of the data output channels. As shown in FIG. 5E, each set of four bits are designated CHO#STRM, CHO#PKT16, CHO#PKT8 and CHO#SNGL, and each bit corresponds to one of the direct-data-transfer types shown in Table II. For example, bits b20 through b23 represent CH02STRM, CH02PKT16, CH02PKT8 and CH02SNGL, respectively, for data output channel 2.

In this embodiment, byte B7 is reserved for future use.

2. Signals and Protocols

The signals and protocols that are used by the functional modules and the arbitration module will now be described. Tables in each of these sections show for each signal the signal name, the signal width and the signal type. The entries in the tables represent maximum numbers and widths according to this preferred embodiment. The numbers and widths of these signals generally will vary from device to device. Furthermore, some of the signals are not needed for some embodiments.

"Width" indicates the number of wires or conductive paths that are used to carry each signal. For example, data bus 1 (D1Bus) is implemented by thirty-two wires and the system reset line (RESETn) is implemented by one wire.

"Type" refers to the nature of the information carried by the signal. All control signals are active low except for the RdWRn signal that toggles between two logic states to indicate whether the current I/O bus operation is for writing data to or reading data from module registers.

a. I/O Interface (1) Description of Signals

The signals that pertain to the I/O bus are shown in the following table:

TABLE III-A

| Signal Name | Width | Type |
|---|---|---|
| IOWBus | 32 | data |
| IORBus | 32 | data |
| IOABus | 10 | address |
| BEn | 4 | control |
| RdWRn | 1 | control |
| IORDYn | 1 | control |
| ModSeln | 7 | control |

The principal module controls the I/O bus to program other modules and obtain module status. During I/O write operations, the I/O data-write bus, IOWBus, carries data to be written into module registers and the I/O address bus, IOWBus, carries the address of the location into which the data is to be written. During I/O read operations, the I/O data-read bus, IORBus, carries data that has been read from module registers and the I/O address bus carries the address of the location from which that data has been read. The byte-enable control signal, BEn, indicates which bytes in a particular 4-byte register are to be written or read.

Referring to FIG. 4A the base address for registers in module 5 is 128. I/O write and read operations at address 129, for example, occur within the second 4-byte register of module 5. the byte-enable control signal indicates which bytes in this register are affected, as shown in the following table:

TABLE IV

| BEn | Byte 3 | Byte 2 | Byte 1 | Byte 0 |
|---|---|---|---|---|
| 1110 | | | | X |
| 1101 | | | X | |
| 1011 | | X | | |
| 0111 | X | | | |
| 1100 | | | X | X |
| 0011 | X | X | | |
| 0000 | X | X | X | X | for example, a BEn signal set to $1101_2$ indicates that only byte 1 is affected and a BEn signal set to $0011_2$ indicates that only byte 2 and byte 3 are affected.

(2) Signal Timing

Figure 6:
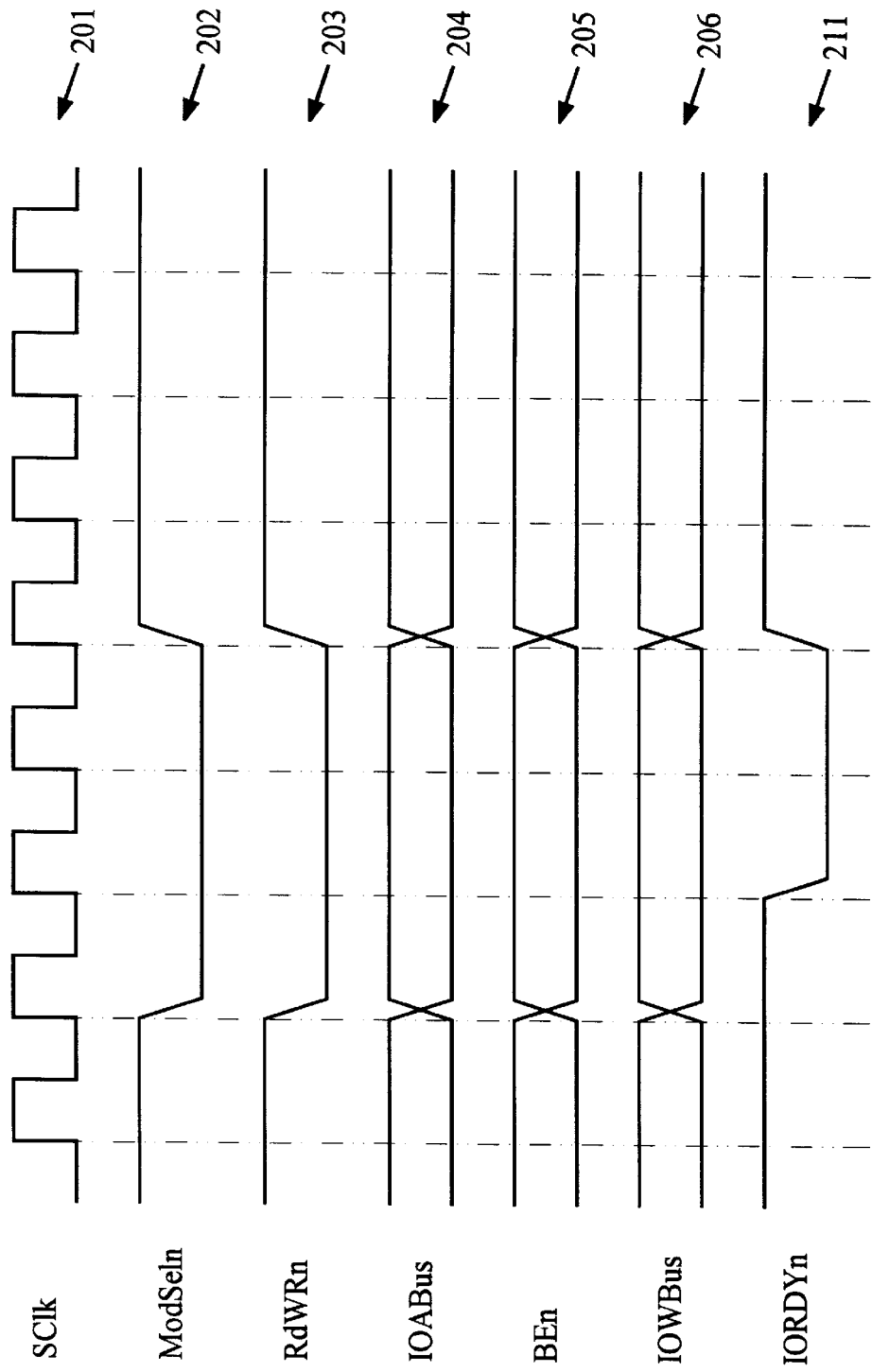
FIGS. 6, 7 and 8 are timing diagrams of hypothetical signals for carrying out write and read operations on an input/output bus.

Referring to FIG. 6, protocol for an I/O write operation will now be described. The principal module, module 1, initiates an I/O write operation by driving onto I/O write-data bus IOWBus 206 the data to be written, driving onto I/O address bus IOABus 204 the address at which the data is to be written, driving onto lines BEn 205 the byte configuration to be written, and driving line RdWRn 203 low to indicate a write operation. In some embodiments, module 1 also selects the desired module by driving an appropriate module-select line ModSeln 202 low. One or two clock cycles later, the module into which the data is written indicates that the write operation has completed by driving IORDYn 211 line low. Subsequently, module 1 and the selected module allow the buses ans lines to their normal states. In the protocol illustrated in FIG. 6, as well as in protocols illustrated in other figures herein, events are triggered by rising edges of system clock SClk 201. This feature is not critical to the practice of the present invention.

Figure 7:
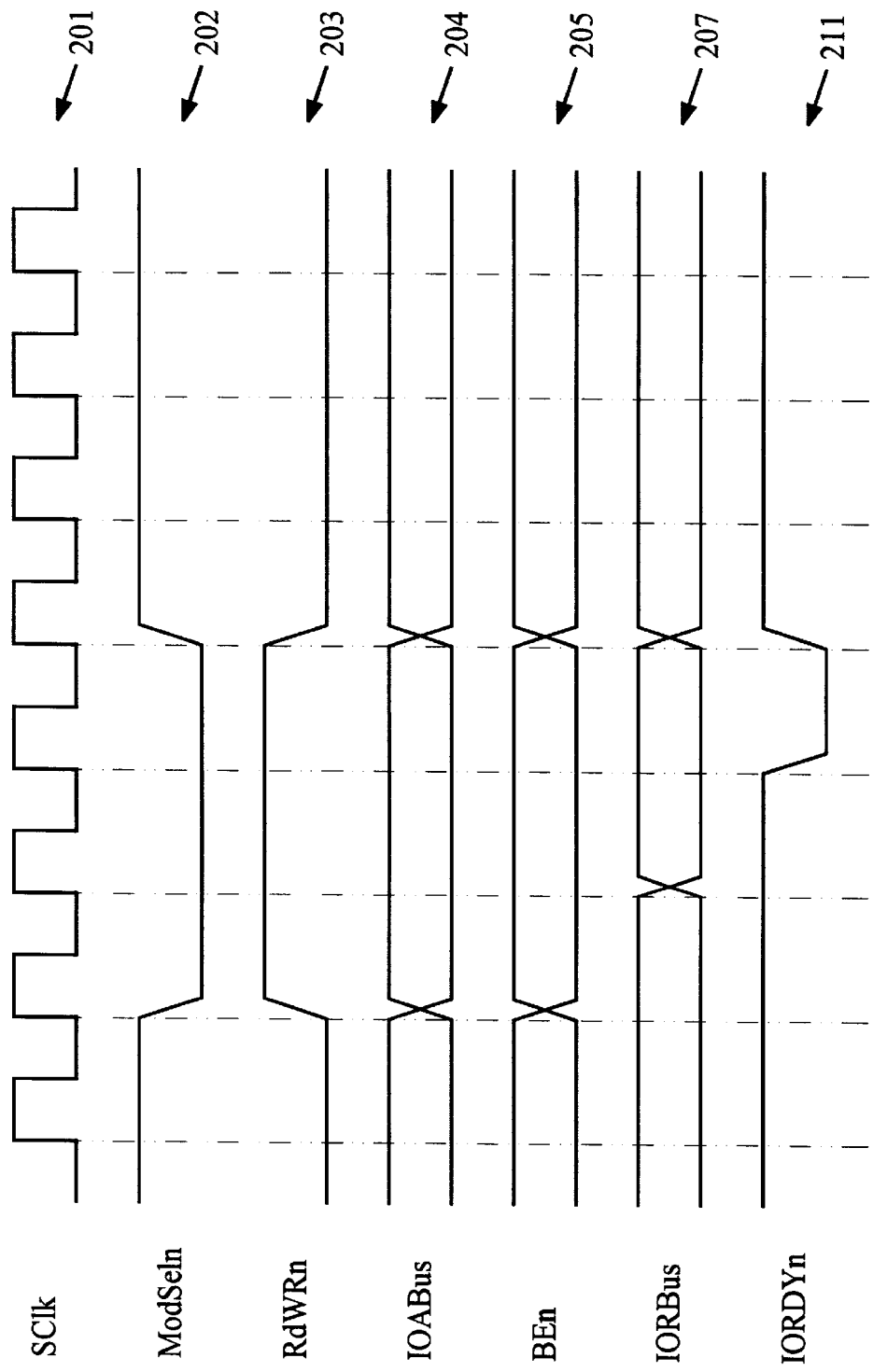

Referring to FIG. 7, a protocol for an I/O read operation will now be described. The principal module, module 1, initiates an I/O read operation by driving onto I/O address bus IOABus 204 the address from which the data is to be read, driving onto lines BEn 205 the byte configuration to be read, and driving line RdWRn 203 high to indicate a read operation. In some embodiments, module 1 also selects the desired module by driving an appropriate module-select line ModSeln 202 low. One clock cycle later, the module from which the data is read drives the requested data onto I/O data-read bus IORBus 207 and subsequently indicates that the read operation has completed by driving line IORDYn 211 low. Subsequently, module 1 and the selected module allow the buses and lines to return to their normal states.

It is anticipated that IC devices implemented according to the present invention will not be required to implement a burst mode for I/O bus operations; however, the present invention is capable of supporting it. Two implementations are discussed here but other implementations are possible. According to a first implementation, module 1 responds to a request for burst mode by incrementing the address on the I/O address bus until the burst has completed. According to a second implementation, all modules increment address counters that are internal to the module so that writes and reads are performed at the correction locations. Preferably, bursts are limited to no more than four bytes to simplify the logic that is required.

Figure 8:
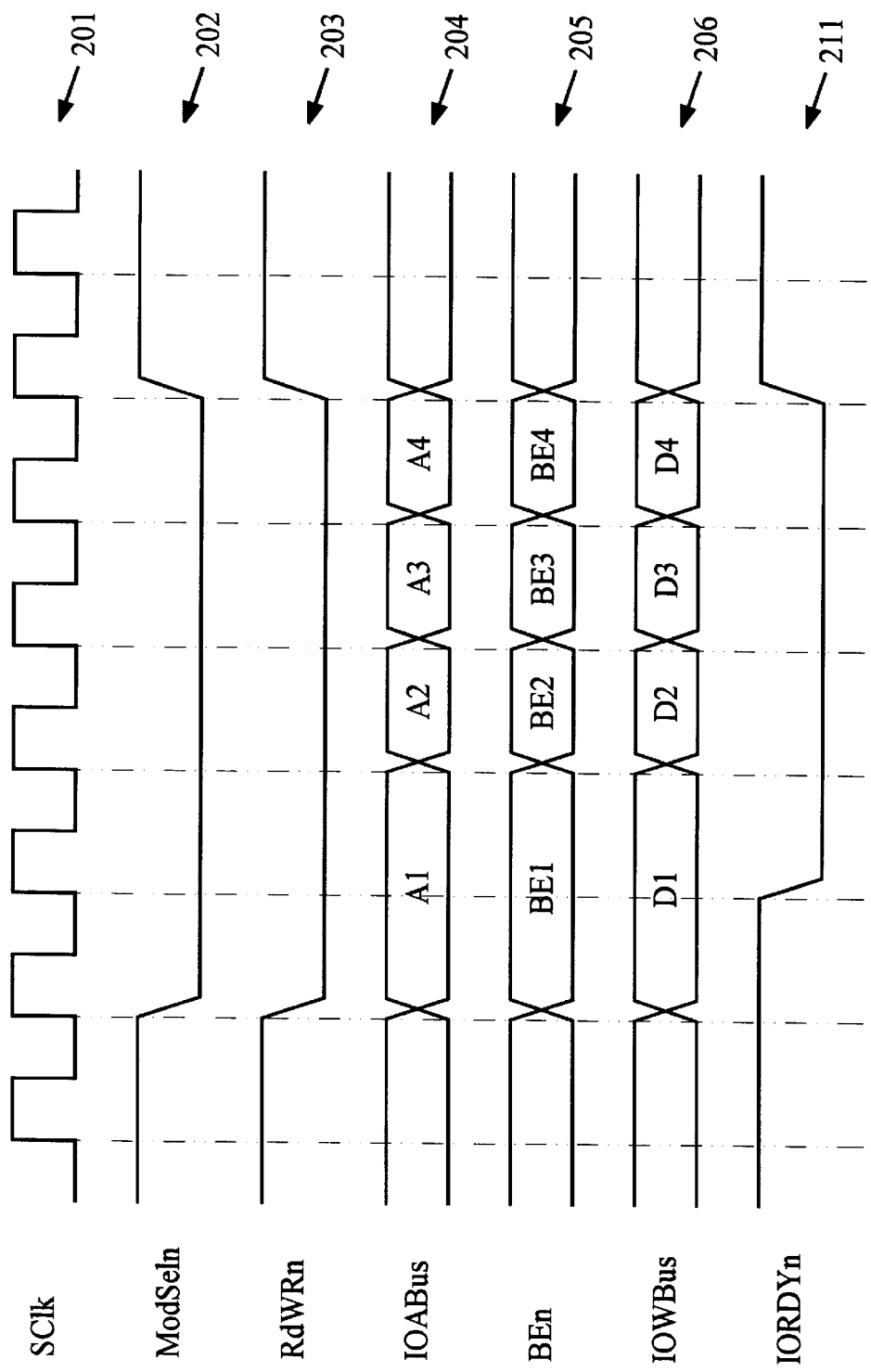

Referring to FIG. 8, a protocol for an I/O burst-write operation will now be described. Module 1 initiates an I/O burst-write operation by driving onto I/O write-data bus IOWBus 206 the first packet of data to be written, driving onto I/O address bus IOABus 204 the address at which the first packet is to be written, driving lines BEn 205 to the appropriate value for the byte configuration to be written, and driving line RdWRn 203 low to indicate a write operation. In some embodiments, module 1 also selects the desired module by driving an appropriate module-select line ModSeln 202 low. One or two clock cycles later, the module into which the data is written indicates that the write operation for the first packet has completed by driving line IORDYn 211 low. In the following clock cycles, module 1 drives subsequent packets onto I/O write-data bus IOWBus 206, drives appropriate addresses onto I/O address bus IOABus 204, and drives appropriate values onto lines BEn 205 until the burst operation is completed. When the burst operation is finished, module 1 and the selected module allow the buses and lines to return to their normal states.

(3) Variations

In a first variation of the preferred embodiment, the IC device uses multiple I/O data-read buses. Each I/O interface in each module is coupled to one of the buses. For example, if it is known at the time the IC device is designed that frequent I/O read activity for two or more modules is likely to contend for a bus, these modules can be coupled to separate buses to reduce the likelihood of contention.

In a second variation of the preferred embodiment, the IC device uses multiple I/O data-read buses that are each coupled to only one module. All of the I/O data-read buses are connected to a multiplexor and the output of the multiplexor is coupled to the I/O interface of module 1. The multiplexor is also coupled to multiple module-select lines, one line for each functional module, and selects the appropriate bus in response to the state of the module-select lines. This variation is illustrated schematically in FIG. 16 and discussed briefly below.

Figure 9:
FIG. 9 illustrates one possible sequence of intervals following a system reset during which an IC device according to the present invention is configured and programmed for operation.

Although I/O write operations may program modules during normal operation of the IC device, it is anticipated that most programming operations will occur during an initial period following system reset. One possible sequence of operations is illustrated in FIG. 9. According to this sequence, a system establishes known system states during interval 221 following an event that causes a system reset. Thereafter, module 1 is configured for PCI bus operation during an interval 221. After module 1 is configured, module 1 initiates a process that is carried out during interval 223 that programs other modules in the IC device and drives buses and other lines to known states. Thereafter, during interval 224 the modules participate in a variety of activities that cause data to be transferred to and from the functional modules. These data transfer activities are described below.

As explained above, references to particular architectures and implementations like PCI buses are exemplary only and are not required to practice the present invention.

b. Data Interface

(1) Description of Signals

The signals that pertain to the data bus are shown in the following table:

TABLE III-B

| Signal Name | Width | Type |
|---|---|---|
| D1Bus | 32 | data |
| D2Bus | 32 | data |
| D3Bus | 32 | data |
| D4Bus | 32 | data |
| DBusBUSYn | 4 | control |
| BUSYn | 10 | control |
| REQn | 12 | control |
| ModID | 60 | control |
| GNTn | 12 | control |
| DBusID | 44 | control |
| STARTn | 10 | control |
| DType | 20 | control |
| DRDYn | 10 | control |

Data is transferred from a "source" module along one of the data buses, D1Bus, D2Bus, D3Bus or D4Bus, to a "destination" module. Each data transfer is preceded by a request that is submitted by the source module to the bus arbitration module. The request includes a 5-bit module identifier or "ModID" for the destination module and a request signal REQn corresponding to the data-output channel of the source module. The ModID, which is driven onto five wires of a ModID bus, is composed of a 3-bit module number of the destination module and a 2-bit direct-data-transfer type that indicates which transfer type the source module intends to use.

According to this preferred embodiment, an IC device may contain modules that collectively have as many as twelve data output channels. Each of the output channels is assigned a number and is allocated a set of five wires to carry the ModID signals to the arbitration module; therefore, the IC device could require as many as sixty conductive paths for all of the ModID signals. These wires are referred to collectively as the ModID bus. The channel number assignments and ModID bus allocation is shown in the following table.

TABLE V

| Channel No. | ModID Bus |
|---|---|
| Channel 1 | [0:4] |
| Channel 2 | [5:9] |
| Channel 3 | [10:14] |

TABLE V-continued

| Channel No. | ModID Bus |
|---|---|
| Channel 4 | [15:19] |
| Channel 5 | [20:24] |
| Channel 6 | [25:29] |
| Channel 7 | [30:34] |
| Channel 8 | [35:39] |
| Channel 9 | [40:44] |
| Channel 10 | [45:49] |
| Channel 11 | [50:54] |
| Channel 12 | [55:59] |

The notation x:y represents a range of conductors or wires in the bus having numbers from x to y. For example, [0:4] represents the first five conductors numbered from 0 to 4.

In response to the REQn and ModID signals, the arbitration module checks the BUSYn lines that correspond to the one or two input channels of the destination module to determine if any input channel is not busy and it checks the DBusBUSYn lines to determine if a data bus is available to carry the data transfer. If an input channel of the destination module is not busy and a bus is available, the arbitration module acknowledges the source module by driving low the GNTn line that is associated with the output channel of the source module and it notifies the input channel of the destination module of the impending data transfer by driving low the STARTn line that is associated with that input channel. The arbitration module informs both the source output channel and the destination input channel of the choice of data bus by signals by driving appropriate signals onto DBusID lines associated with those channels. The arbitration module also informs the input channel of the direct-data-transfer type by driving appropriate signals onto the DType lines that are associated with the input channel.

According to this preferred embodiment, an IC device may contain modules that collectively have as many as ten data input channels. Each of the input channels and each of the output channels is allocated a two-wire conductive path to carry the DBusID signals from the arbitration module; therefore, the IC device could require as many as forty-four conductive paths for all of the DBusID signals.

When the destination module receives the STARTn signal, it drives the appropriate BUSYn line low to indicate it is busy, configures itself according to the data-transfer type received from the DType lines and, drives an appropriate DRDYn line low when it is ready. When the source module receives the GNTn signal, it drives the appropriate DBus-BUSYn line low to indicate the selected data bus is in use and, when it detects the appropriate DRDYn line goes low, it commences the data transfer. When the data transfer is complete, the source module allows the appropriate DBus-BUSYn line to come high and the destination module allows the appropriate BUSYn line to come high.

If no data bus is available or if all input channels in the destination module are busy, the request from the source module remains pending until both conditions are satisfied. If one or more other requests arrive before the first request can be serviced, one or more methods may be used to arbitrate which request is serviced first. Arbitration is discussed in more detail below.

If any module is intermediate to the source and destination of a data transfer, the intermediate module does not need to store the transferred data but, instead, can transfer the data in a "fly-by" mode.

Normally, data is transmitted on a rising edge of the bus clock signal and is received on the subsequent rising edge.

In one embodiment, the internal buses operate at a clock speed of 66 MHz; therefore, each 32-bit bus can carry bursts of data at a rate of 264 MBytes per second. In a preferred embodiment, data can be transferred at twice this rate by programming the output channel to transmit data on rising clock edges and programming the input channels to receive data on falling clock edges. This feature may be adaptive, allowing the programming of the input and output channels to match requirements that are imposed internal and/or external to the IC device.

(2) Signal Timing

Figure 10:
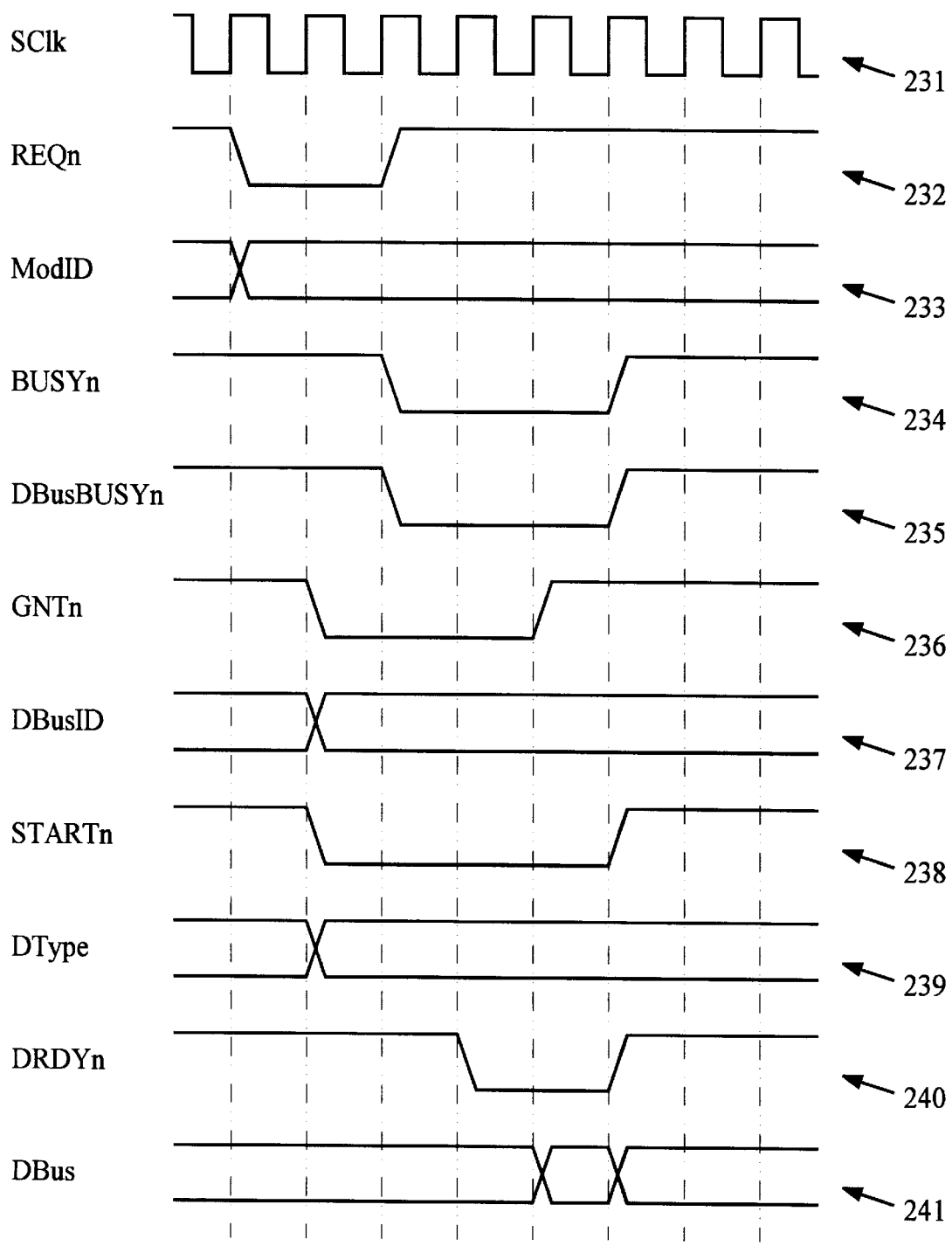

Referring to FIG. 10, a protocol for initiating a data transfer to one destination module with one input channel will now be described. The source module requests permission to initiate a data transfer by driving an identifier of the destination module onto lines ModID 233 and driving line REQn 232 low. The data-bus arbitration module checks the status of a appropriate line BUSYn 234 for the data-input channel in the destination module and checks the availability of a data bus by checking the status of the DBusBUSYn lines. In the example shown in the figure, the signal for only one line DBusBUSYn 235 is shown. In the example shown, the destination input channel and a data bus are both available; therefore, the arbitration module acknowledges the source module by driving line GNTn 236 low and providing an identifier of the data bus to use on lines DBusED 237. The arbitration module also notifies the destination module by driving line STARTn 238 low and driving the specified data-transfer type onto lines DType 239. Subsequently, the source module drives line DBusBUSYn 235 low and the destination module drives lines BUSYn 234 low. When the destination module is ready to receive the data, it drives line DRDYn 240 low and, in response, the source module drives the data to transfer onto data bus DBus 241. When the data transfer is completed, the source and destination modules allow lines DBusBUSYn 235 and BUSYn 234 to go high, respectively.

Figure 11:
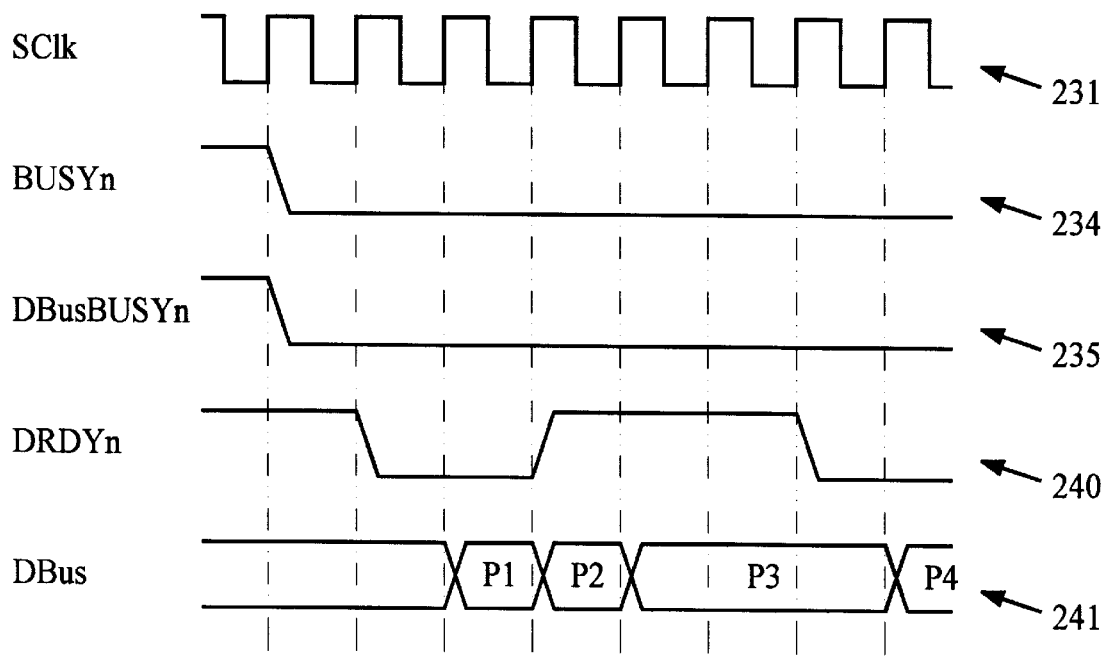
FIGS. 10, 11 and 12 are timing diagrams of hypothetical signals for controlling the transfer of data to and from modules.

FIG. 11 illustrates a portion of a protocol for transferring multiple packets of data using a data-transfer type such as such STRM or PKT8, mentioned above. In response to the destination module signaling its readiness by driving line DRDYn 240 low, the source module commences driving data packets starting with P1 onto data bus DBus 241. Subsequently, the destination module signals that it is unable to continue receiving packets by allowing line DRDYn 240 to come high. In response, the source module suspends the data transfer. When the destination module is able to continue receiving packets, it drives line DRDY240 low and, in response, the source module resumes the data transfer.

(3) Variations

In a first variation of the preferred embodiment, a source module may transfer data simultaneously to input channels of two destination modules or, alternatively, to two input channels of a single destination module, if both input channels are available to receive the data. For ease of discussion, the two destinations are referred to herein as two distinct modules but it should be understood that the same principles apply to distinct input channels in one module. This variation may be carried out in a manner similar to that described above for the preferred embodiment. The differences are described below.

According to this variation for two destination modules, the source module asserts the appropriate REQn line and drives the 5-bit identifier of the first destination module onto the appropriate wires of the ModID bus for one clock cycle, then drives the 5-bit identifier of the second destination module onto the ModID bus for the immediately subsequent clock cycle. If only one destination module is requested, the source module asserts the appropriate REQn line and drives the 5-bit identifier of the only destination module onto the ModID bus for one clock cycle and then drives a 5-bit binary zero onto the ModID bus for the immediately subsequent clock cycle. In response to the REQn line going low, the arbitration module latches the first destination module identifier during the first clock cycle.

If the arbitration module receives only one non-zero destination module identifier, the protocol proceeds as described above for the preferred embodiment.

If the arbitration module receives two non-zero destination module identifiers, it checks the BUSYn lines for all input channels in both modules to determine if both modules have an input channel that is not busy and it checks the DBusBUSYn lines to determine if a bus is available to convey data from the source module to both destination modules. If both destination modules and a suitable data bus are available, the arbitration module acknowledges the source module and notifies both destination modules in a manner similar to that described above for the preferred embodiment.

If any destination module is not available or if no suitable data bus is available, the request from the source module remains pending until both conditions are satisfied. Arbitration is discussed in more detail below.

Figure 12:
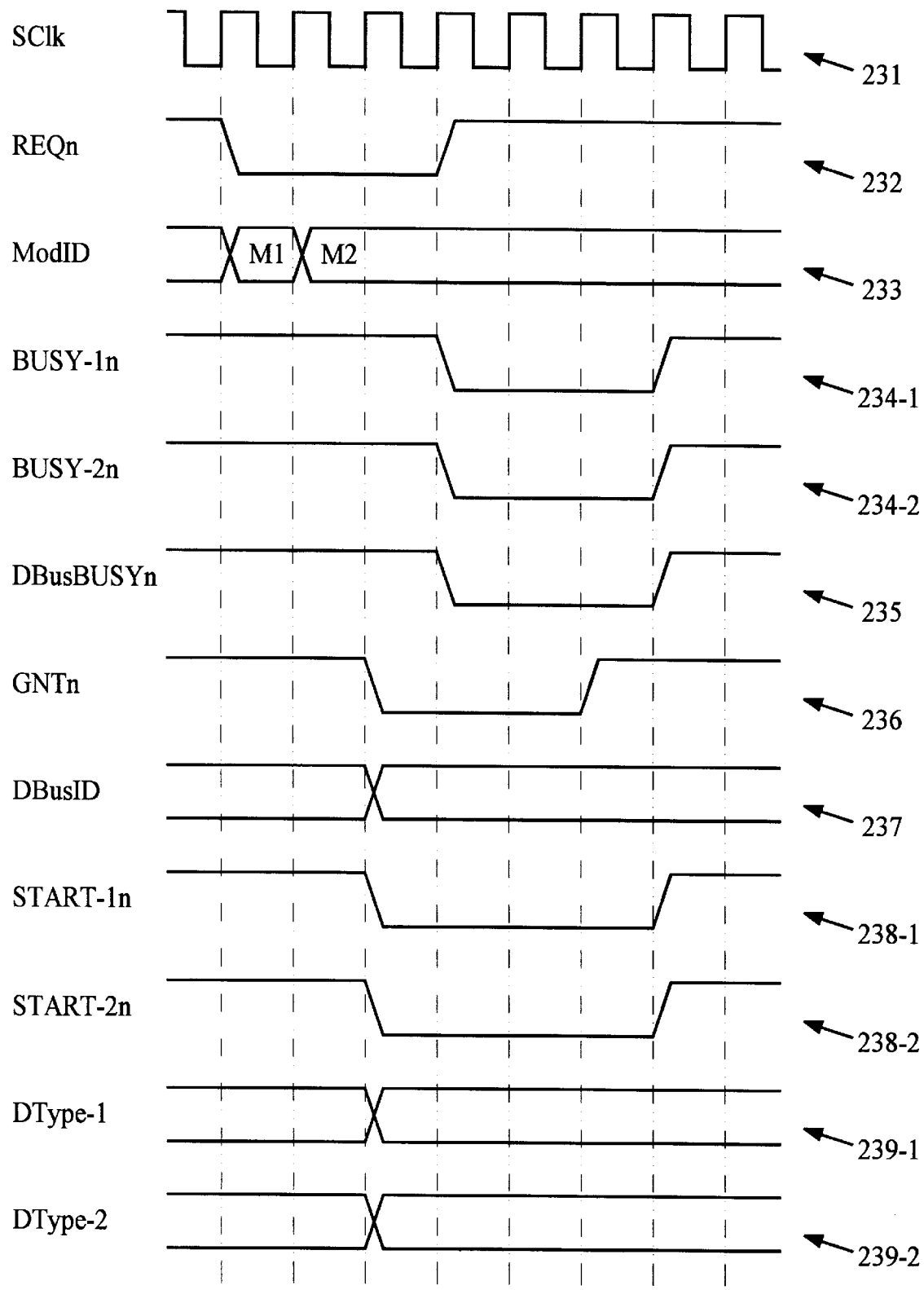

Referring to FIG. 12, a protocol for initiating a data transfer to two destination modules, each with one input channel, will now be described. The source module requests permission to initiate a data transfer by driving an identifier of the first destination module onto lines ModID 233 and driving line REQn 232 low. The data-bus arbitration module latches the identifier of the first destination module. In the subsequent clock cycle, the source module drives an identifier of the second destination module onto lines ModID 233. The arbitration module checks the status of BUSYn lines 234-1 and 234-2 for the first and second destination modules, respectively, and checks the availability of a data bus by checking the status of the DBusBUSYn lines. In the example shown in the figure, the signal for only one line DBusBUSYn 235 is shown. In the example shown, the input channel for both destination modules and a suitable data bus are available; therefore, the arbitration module acknowledges the source module by driving line GNTn 236 low and providing an identifier of the data bus to use on lines DBusID 237. The arbitration module also notifies the destination modules by driving STARTn lines 238-1 and 238-2 low and driving the specified data-transfer type onto DType lines 239-1 and 239-2. Subsequently, the source module drives line DBusBUSYn 235 low and the destination modules drive BUSYn lines 234-1 and 234-2 low. When the data transfer is completed, the source and destination modules allow lines DBusBUSYn 235 and BUSYn 234-1 and 234-2 to go high.

The transfer of data may be carried out in a manner similar to that described above for the preferred embodiment. In this manner, either destination module may cause the source module to suspend the data transfer by raising a respective DRDY line. In alternative embodiments of either the preferred embodiment or this first variation, data transfers are carried out without use of any DRDY lines by ensuring that destination modules have sufficient bandwidth to receive the transfer.

Figure 13:
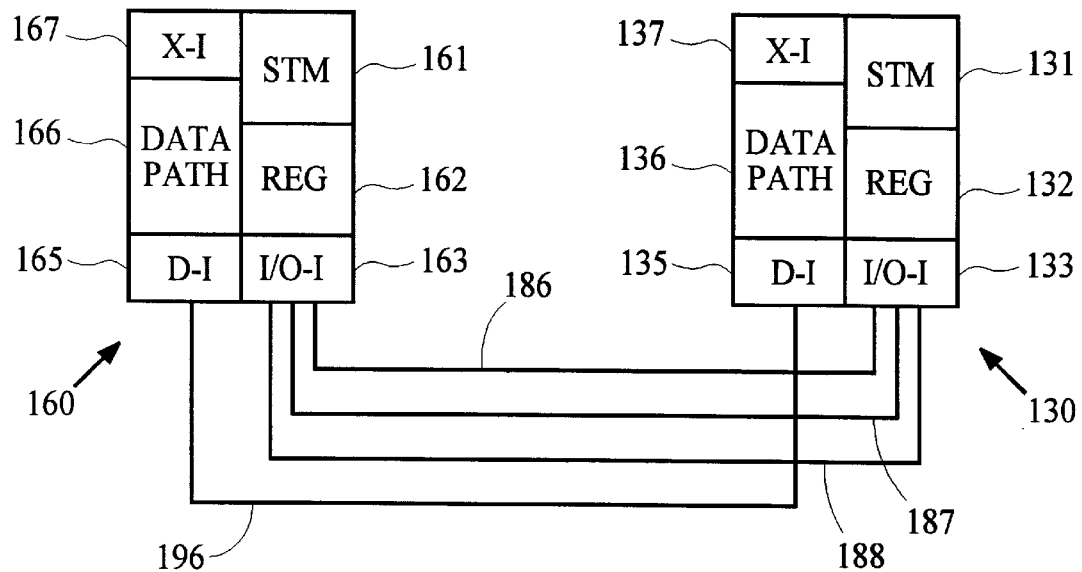
FIG. 13 is a schematic diagram of two modules that transfer data and control signals over point-to-point connections without need for arbitration.

In a second variation of the preferred embodiment, as shown in FIG. 13, source module 160 may transfer data to a destination modules 130 without bus arbitration over conductive paths that are coupled to the modules in point-to-point fashion. In this variation, data is transferred over data path 196 and control signals are exchanged over paths 186 to 187.

According to this second variation, source module 160 drives line REQn 186 low to notify destination module 130 of the impending transfer. If destination module 130 is available to receive the transfer, it acknowledges source module 160 by driving line GNTn 187 low. In one embodiment, source module 160 can now begin the data transfer. In another embodiment, source module 160 begins the data transfer after destination module 130 drives line DRDYn 188 low to indicate it is ready to receive the transfer. In this latter embodiment, destination module 130 is able to cause source module 160 to suspend the transfer by allowing line DRDYn 188 to come high.

A module may couple to one or more modules according to this second variation. Furthermore, modules that participate in point-to-point transfers according to this second variation may also couple to one or more data buses to participate in data transfers according to the preferred embodiment and/or according to the first variation.

c. Data Bus Access Arbitration

(1) Overview of Arbitration

Two or more requests to transfer data may contend with one another for a particular data bus or a particular destination module. In a preferred embodiment, an IC device includes a module to arbitrate contending requests according to any one of several arbitration techniques including round-robin and priority schemes. As mentioned above, it is often preferable to design a specific arbitration module for each IC device instead of using a generic all-purpose design because specific designs usually achieve smaller and faster modules. The complexity of the arbitration module can be adjusted to balance the cost of implementing complex logic with the performance gains achievable by more complex arbitration schemes.

An implementation of an arbitration module will now be described that can arbitrate requests for simultaneous data transfers to two input channels, as described above for the first variation of a preferred embodiment. In this description, the term "request type 1:1" denotes a request for transfer to one destination and the term "request type 1:2" denotes a request for simultaneous transfer to two destinations including two input channels in the same destination module.

This implementation arbitrates according to the following rules.

Arbitration priority is determined by two schemes selectable by a programmable bit in a register of the arbitration module.

When the programmable bit is set to one, arbitration priority is based on request type, e.g., 1:1 or 1:2, and data-transfer type, e.g., STRM or PKT8.

When the programmable bit is set to zero, arbitration priority is based on only the request type.

Type 1:2 requests are given higher priority than type 1:1 requests.

Within each request type, when the programmable bit is set to one, priority is assigned according to the data-transfer type as shown above in Table II. If two requests have the same transfer type, the requests are assigned priority by channel number as shown in Table V.

Within each request type, when the programmable bit is set to zero, priority is assigned by channel number as shown above in Table V.

This particular arbitration scheme is not critical to the practice of the present invention. Essentially any type of arbitration may be used.

(2) Logic Flow for One Embodiment of Arbitration

Figure 14B:
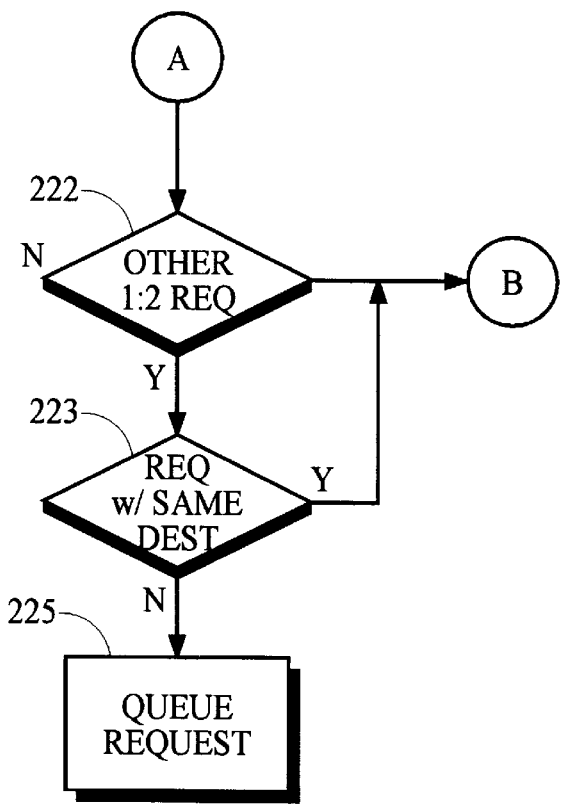
FIGS. 14A, 14B and 14C illustrates an exemplary flowchart according to one embodiment of a data bus arbitration module.
Figure 14A:
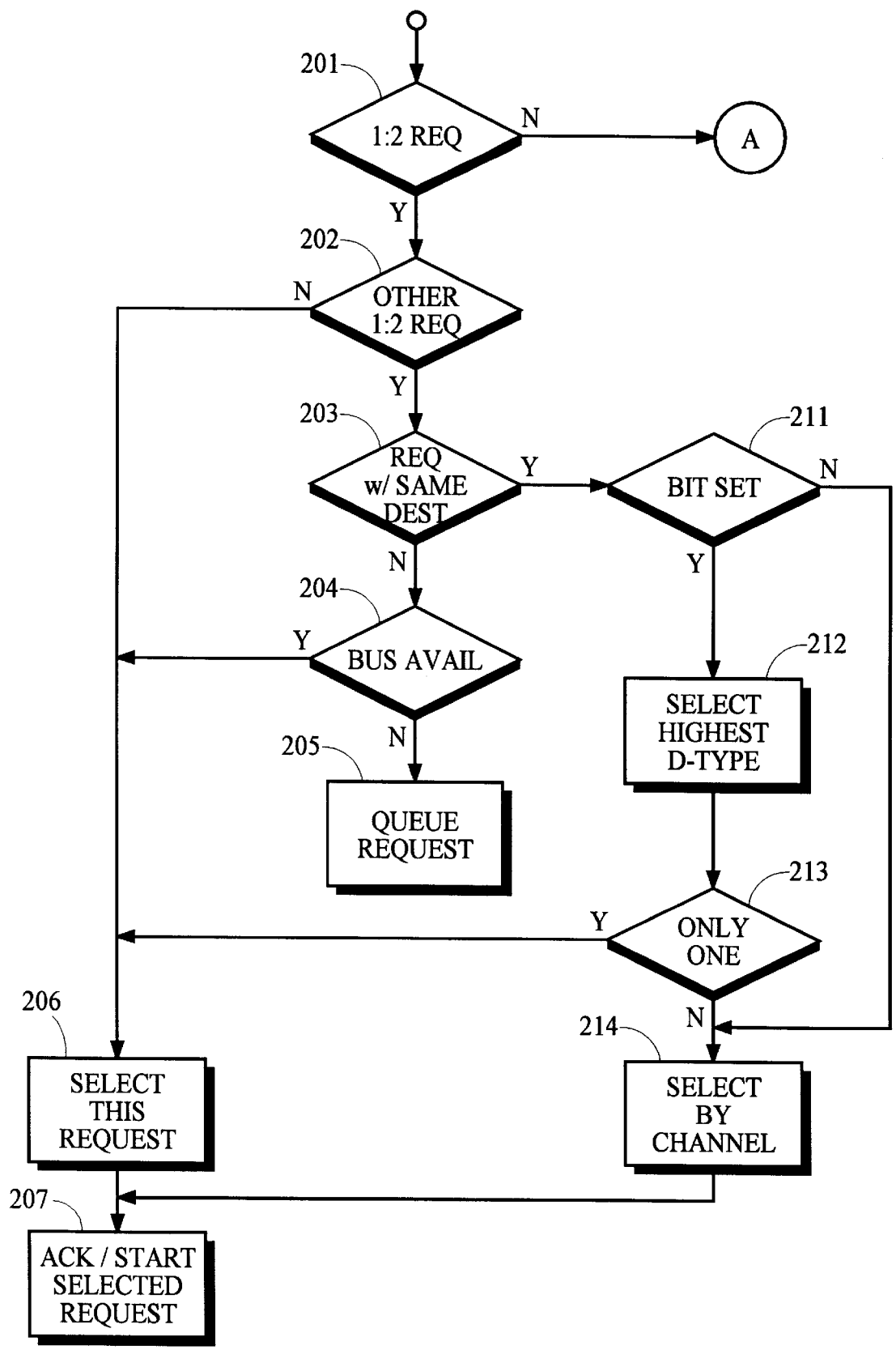
Figure 14C:
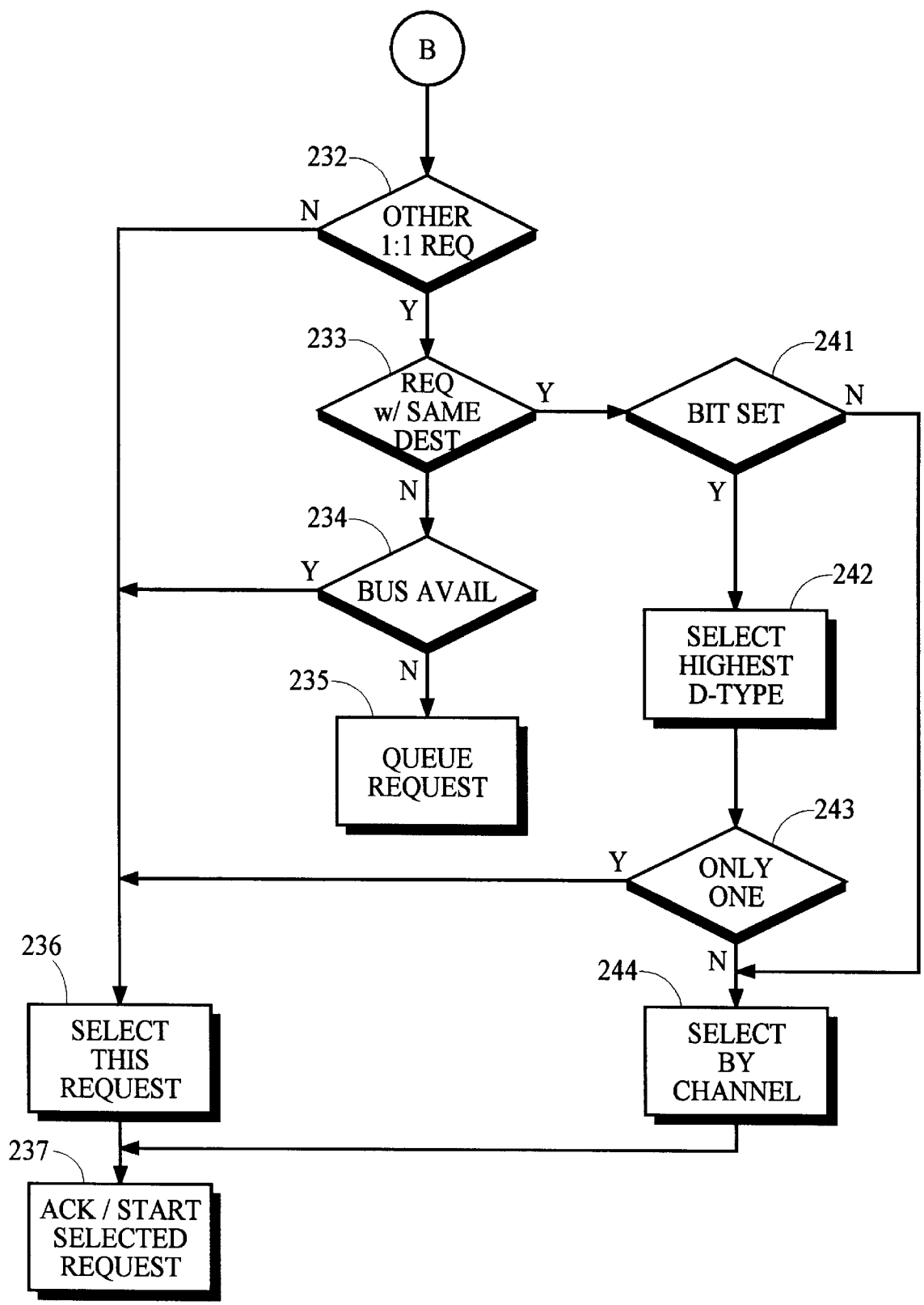

FIGS. 14A through 14C illustrates a flowchart that implements these rules. Referring to FIG. 14A, step 201 determines whether a new request is a type 1:2 request. If it is a 1:2 type request, step 202 determines whether any other pending or queued requests are also type 1:2. If no other queued requests are type 1:2, the new request is designated as the "selected request" in step 206. In step 207, the source module of the selected request is acknowledged and the destination modules are notified by respective STARTn signals.

If step 202 determines that there are other queued type 1:2 requests, step 203 determines if the new request and the other queued 1:2 requests have a common destination. If not, step 204 determines if a bus is available to transfer data from the source module to the destination modules. If a bus is available, the new request is designated as the selected request in step 206 and subsequently started in step 207. If step 204 determines that a bus is not available, the new request is queued.

If step 203 determines that the new request and another queued request have the same destination, step 211 determines if the programmable bit, discussed above, is set. If the programmable bit is not set, step 214 selects from the queued and the new 1:2 requests by channel number in round-robin fashion. If the programmable bit is set, step 212 determines the highest priority data-transfer type from among the queued and new 1:2 requests and identifies which of these requests have that data-transfer type. Step 213 determines if only one request has this highest priority data-transfer type. If there is only one request, step 206 designates this request as the selected request and step 207 starts this request. If more than one request has the highest priority data-transfer type, step 214 selects the request by channel number in round-robin fashion. The request selected in step 214 is started in step 207.

If step 201 determines that the new request is type 1:1 rather than type 1:2, step 222 shown in FIG. 14B determines if there are any queued type 1:2 requests. If there are queued type 1:2 requests, step 223 determines if the new request and the queued 1:2 requests have a common destination. If they do have a common destination, step 225 queues the new request.

If either step 222 determines that there are no queued 1:2 requests or step 223 determines that the new 1:1 request and a queued 1:2 request do not have the same destination, then step 232 shown in FIG. 14C determines whether any other queued requests are also type 1:1. If no other queued requests are type 1:1, the new request is designated as the selected request in step 236. In step 237, the source module of the selected request is acknowledged and the destination module is notified by a STARTn signal.

If step 232 determines that there are other queued type 1:1 requests, step 233 determines if the new request and the other queued 1:1 requests have a common destination. If not, step 234 determines if a bus is available to transfer data from the source module to the destination module. If a bus is available, the new request is designated as the selected request in step 236 and subsequently started in step 237. If step 234 determines that a bus is not available, the new request is queued.

If step 233 determines that the new request and another queued request have the same destination, step 241 determines if the programmable bit, discussed above, is set. If the programmable bit is not set, step 244 selects from the queued and the new 1:1 requests by channel number in round-robin fashion. If the programmable bit is set, step 242 determines the highest priority data-transfer type from among the queued and new 1:1 requests and identifies which of these requests have that data-transfer type. Step 243 determines if only one request has this highest priority data-transfer type. If there is only one request, step 236 designates this request as the selected request and step 237 starts this request. If more than one request has the highest priority data-transfer type, step 244 selects the request by channel number in round-robin fashion. The request selected in step 244 is started in step 237.

d. User Interface

The signals that pertain to the user interface are shown in the following table:

TABLE III-C

| Signal Name | Width | Type |
|---|---|---|
| UserIn | 3 | general |
| UserOut | 3 | general |

A user interface may be used to send and/or receive signals intended for some special purpose that cannot be satisfied by the I/O and data buses discussed above, or which must be exchanged by modules without contending for an I/O bus or a data bus. The preferred embodiment provides for as many as three input and three output signals that can be exchanged according to essentially any protocol and can be used for essentially any purpose.

e. System Signals

The system signals, which are generated by components that are external to the IC device, are shown in the following table:

TABLE III-D

| Signal Name | Width | Type |
|---|---|---|
| RESETn | 1 | control |
| SClk | 1 | clock |

In the preferred embodiment, logic implementing each module is clocked by signal SClk that is generated external to the IC device. In alternative embodiments, all or some of the logic in an IC device may be clocked by another signal such as, for example, a clock signal that is generated internally in the IC device. Such an embodiment may allow the IC device to operate at a prescribed speed that is independent of external clock speeds.

The preferred embodiment uses one RESETn signal to indicate when the IC device should reset itself In alternative embodiments, multiple reset signals may be used. For example, one or more signals could indicate distinct reset conditions caused by hardware, software or power-on situations. In such embodiments, the IC device could reset itself in different ways according to the type of reset condition to serve specific application requirements.

D. Additional Embodiments

Figure 15:
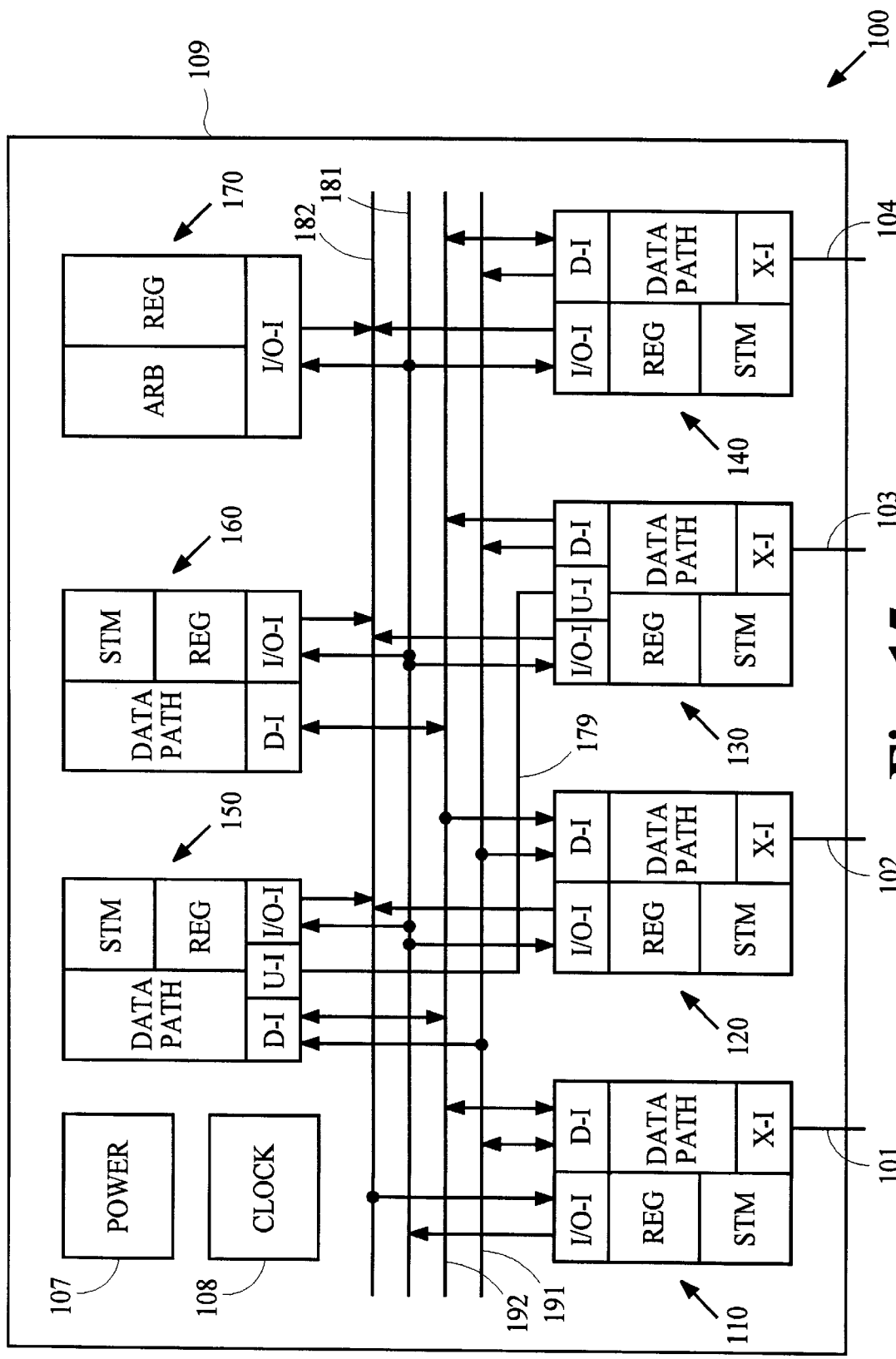
FIG. 15 is a schematic diagram of an embodiment of an integrated circuit device that illustrates various connections between modules.
Figure 16:
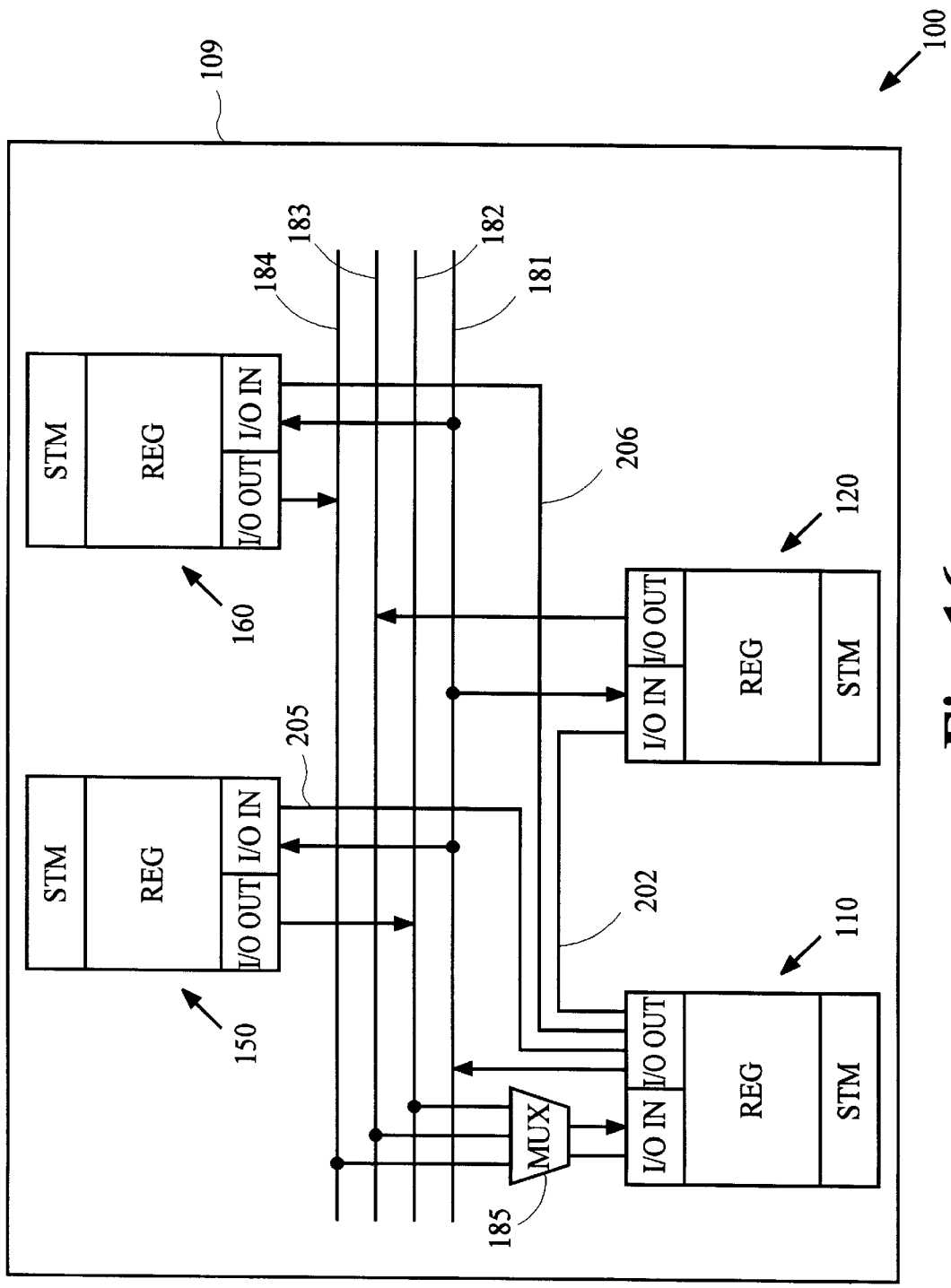
FIG. 16 is a schematic diagram illustrating how selected components of several modules may couple to multiple input/output read buses in an embodiment that uses bus multiplexing rather than tri-state logic connections.
Figure 17:
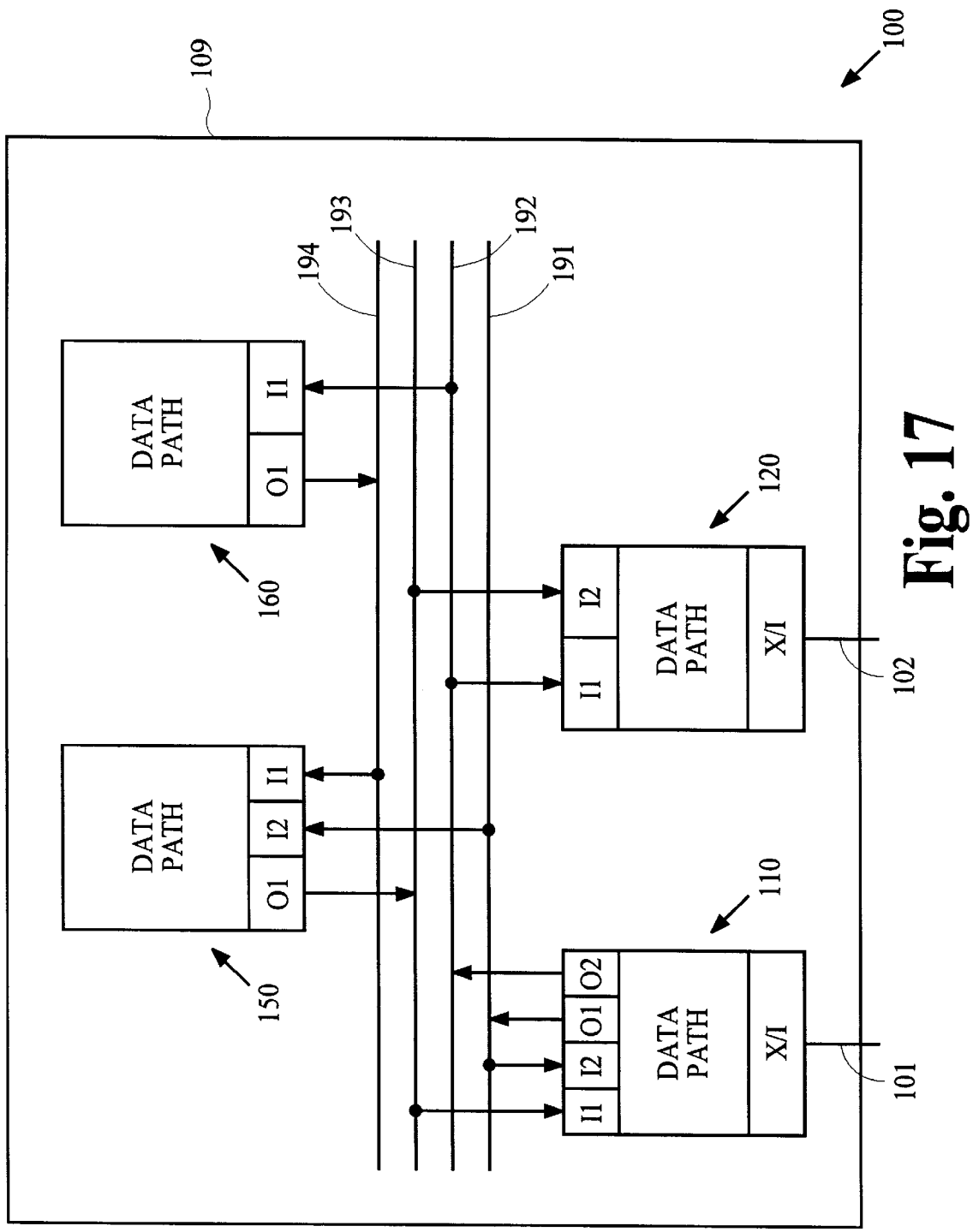
FIG. 17 is a schematic diagram illustrating how selected components of several modules may couple to multiple data buses in an embodiment that does not use bus arbitration.

FIGS. 15 through 17 are schematic illustrations of features in three alternative embodiments of IC device 100. The embodiment illustrated in FIG. 15 is substantially similar to the preferred embodiment discussed above and represents one way in which the IC device illustrated in FIG. 2 may be implemented. In this embodiment, IC device 100 includes I/O write bus 181, I/O read bus 182, and two data buses 191 and 192. Because one I/O read bus is shared by all modules, it is anticipated that the I/O interface circuits couple to this bus using tri-state logic. Each data-input channel and each data-output channel in a respective module is connected to only one data bus. Path 179 connects modules 130 and 150 by way of user interface circuits. External interface circuits are coupled to conductive paths 101 through 104 that may be accessed from outside the device.

FIG. 16 illustrates an alternative embodiment for interconnecting I/O interface circuits by one I/O write bus and multiple I/O read buses. Module components that are not directly related to the I/O interface circuits are omitted from the figure for illustrative clarity. In this embodiment, I/O write bus 181 carries information from module 110 to the other modules. Module-select lines 202, 205 and 206 allow module 110 to select modules 120, 150 and 160, respectively. Three distinct I/O read buses 182 through 184 carry information from the other modules through multiplexor 185 to the I/O bus interface circuits in module 110. A line is provided for module 110 to control which I/O read bus is selected by multiplexor 185. Tri-state logic is not required for the modules to couple to the I/O read buses.

FIG. 17 illustrates an alternative embodiment for interconnecting data interface circuits by multiple data buses. Module components that are not directly related to the data interface circuits are omitted from the figure for illustrative clarity. In this embodiment, each data bus is coupled to one data-output circuit and no more than two data-input circuits. For example, data bus 191 is coupled to the data-output circuit of module 110 and the data-input circuit of module 150. Data bus 193 is coupled to the data-output circuit of module 150 and the data-input circuits of modules 110 and 120. This particular embodiment does not require data-bus arbitration because data-output circuits can never contend for the same data bus. In this embodiment, the data-output circuit of a source module may transfer data to one data-input channel or to two data-input channels simultaneously by notifying the respective destination modules along paths not shown in the figure.

E. Examples of Applications

Figure 18:
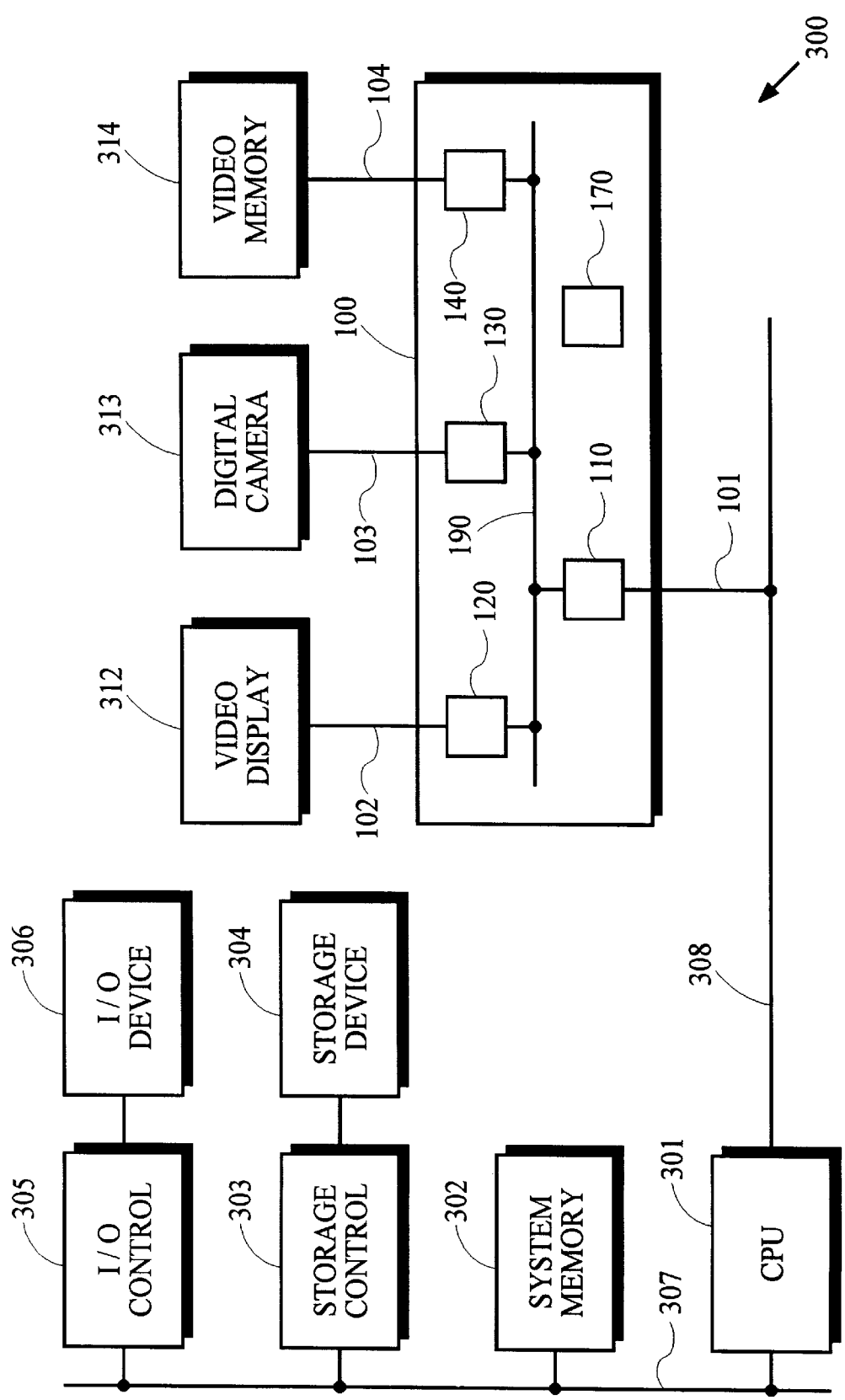
FIG. 18 is a schematic diagram of major components in a computer system incorporating an integrated circuit device according to the present invention for processing and displaying images conveyed by video signals.

An IC device that is implemented according to various techniques of the present invention may be used in a wide range of applications and systems. For example, an IC device according to the present invention may be included in a computer system for processing and displaying images carried by video signals. FIG. 18 is a schematic illustration of the major components in such a system. Neither the components shown in the figure nor the structure of the system is important to the practice of the present invention.

According to the example shown, system 300 includes bus 307 such as an ISA bus that is coupled to central processing unit 301 such as a microprocessor, system memory 302 such as random access memory, storage control 303 and I/O control 305. Storage control 303 is coupled to and controls information storage device 304 such as a magnetic disk drive or magnetic tape drive. I/O control 305 is coupled to and controls input/output device 306 such as a keyboard, mouse, printer, modem or network adaptor. CPU 301 is also coupled to bus 308 such as a PCI bus.

IC device 100 comprises functional modules 110, 120 and 130, and arbitration module 170. Each of the functional modules have data interface circuits that are coupled to one or more data buses 190. Module 110, which is the principal module for IC device 100, has an external interface that is coupled to bus 308. Functional modules 120, 130 and 140 each have external interfaces that are coupled to video apparatuses that are external to the IC device as shown. Module 120 is coupled to video display 312, module 130 is coupled to digital camera 313 and module 140 is coupled to video memory 314.

There is no significance to which components are internal or external to IC device 100. For example, IC device 100 could include a functional module equivalent to storage control 303 for controlling a storage device. There is also no significance that the example shows IC device 100 incorporated into a computer system. IC devices according to the present invention may be used in essentially type of electronic apparatus.

The present invention pertains to features of display adaptor 8; therefore, all of the components illustrated in FIG. 1 are not required to practice the present invention. For example, a display adaptor incorporating aspects of the present invention may be used in an information processing system that includes only CPU 2, input/output 3 connected to some input device 4 such as a switch or keypad, RAM 5, display adaptor 8 and display device 9.

What is claimed is:

1. An integrated circuit device that comprises:
   (a) an enclosure having a plurality of electrical connections accessible outside said enclosure;
   (b) a bus comprising a plurality of conductive paths internal to said enclosure;
   (c) a first module internal to said enclosure that has
      a first interface circuit connected to said bus that operates according to a bus-access protocol,
      a first data path circuit coupled to said first interface circuit,
      one or more first registers coupled to said first interface circuit,
      a first state machine coupled to one of said first registers and coupled to said first data path circuit so as to control said first data path circuit, and
      a first external interface circuit coupled to said first data path circuit and coupled to one or more of said electrical connections; and
   (d) one or more second modules internal to said enclosure, wherein each second module has
      a respective second interface circuit connected to said bus that operates according to said bus-access protocol,
      a respective second data path circuit coupled to said respective second interface circuit,
      one or more respective second registers coupled to said respective second interface circuit, and
      a respective second state machine coupled to one of said respective second registers and coupled to said respective second data path circuit so as to control said respective second data path circuit.

2. An integrated circuit device according to claim 1, wherein a portion of said plurality of conductive paths form an input/output (I/O) bus and a portion of said plurality of conductive paths form a first data bus, for said first module:
   said first interface circuit comprises a first I/O interface circuit coupled to said I/O bus and a first data interface circuit coupled to said first data bus, said first I/O interface circuit operating according to an I/O-bus-access protocol and said first data interface circuit operating according to a data-bus-access protocol,
   said first data path circuit is coupled to said first data interface circuit, and
   said one or more first registers are coupled to said first I/O interface circuit, and for each of said second modules:
      said respective second interface circuit comprises a respective second I/O interface circuit coupled to said I/O bus and a respective second data interface circuit coupled to said first data bus, said respective second I/O interface circuit operating according to said I/O-bus-access protocol and said respective second data interface circuit operating according to said data-bus-access protocol,
      said respective second data path circuit is coupled to said respective second data interface circuit, and
      said one or more respective second registers are coupled to said respective second I/O interface circuit.

3. An integrated circuit device according to claim 2, wherein said I/O bus comprises an I/O read bus and an I/O write bus, said I/O read bus carrying signals from said second modules to said first module and said I/O write bus carrying signals from said first module to said second modules, wherein said first I/O interface circuit and respective second I/O interface circuits couple to said I/O read bus using tri-state connections.

4. An integrated circuit device according to claim 3, wherein each of said second I/O interface circuits is coupled to a respective module-select conductive path that is coupled to said first I/O interface circuit.

5. An integrated circuit device according to claim 3, wherein each of said second I/O interface circuits comprises a decoder that is adapted to decode a respective range of addresses conveyed by said I/O bus.

6. An integrated circuit device according to claim 2, wherein said I/O bus comprises an I/O write bus and a plurality of I/O read buses, said I/O write bus carrying signals from said first module to said second modules, each of said I/O read buses coupled to said second I/O interface circuit in a respective second module to carry signals from said respective second module to said first module, wherein said first I/O interface circuit comprises a multiplex circuit coupled to said plurality of I/O read buses.

7. An integrated circuit device according to claim 2 that comprises a plurality of said second modules, wherein said first data bus consists of a plurality of second data buses that are substantially independent of one another, and wherein each of said second data buses is coupled to said first data interface circuit and to at least one of said respective second data interface circuits.

8. An integrated circuit device according to claim 7 that comprises a data bus arbitration module coupled to said first module and coupled to each of said second modules to receive requests for access to said second data buses and to send approval for said requests, wherein said bus arbitration module is coupled to said I/O bus and is programmable by signals received from said I/O bus to arbitrate said requests according to one or more arbitration techniques.

9. An integrated circuit device according to claim 7 that comprises a plurality of said second modules, wherein at least one of said respective second data interface circuits is adapted to receive data from two or more of said second data buses and at least one of said respective data interface circuits is adapted to send data to two or more said second data buses.

10. An integrated circuit device according to claim 2 that comprises a plurality of said second modules, wherein at least one of said respective second data interface circuits is adapted to only receive data from said first data bus and at least one of said respective data interface circuits is adapted to only send data to said first data bus.

11. An integrated circuit device according to claim 2 that comprises a plurality of said second modules, and comprises a data bus arbitration module coupled to said first module and coupled to each of said second modules to receive requests for access to said first data bus and to send approval for said requests, wherein said bus arbitration module is coupled to said I/O bus and is programmable by signals received from said I/O bus to arbitrate said requests according to one or more arbitration techniques.

12. An integrated circuit device according to claim 2 that comprises at least one second module having a respective second data path circuit comprising logic that modifies data received from or sent to said respective data interface circuit.

13. An integrated circuit device according to claim 12, wherein said at least one second module has a respective second external interface circuit coupled to said respective second data path circuit and coupled to one or more of said electrical connections.

14. An integrated circuit device according to claim 2 that comprises one or more special-purpose conductive paths, wherein said second bus interface circuit for two or more respective second modules comprises a special-purpose interface circuit coupled to said one or more special-purpose conductive paths, thereby directly coupling said two or more respective second modules.

15. An integrated circuit device according to claim 1, wherein said first module and each of said second modules are implemented by cells or gates that predominantly are contiguous with one another.

16. A method for generating a technology-dependent design specification for an electronic device that includes a bus internal to said electronic device, wherein said method comprises:

generating a first description of said electronic device using hardware description language, said first description describing one or more modules each having a bus interface internal to said electronic device that couples to said bus and conforms to a bus access protocol;

obtaining a third description of said electronic device by combining said first description with one or more second descriptions, each of said second descriptions describing one or more modules each having a bus interface internal to said electronic device that couples to said bus and conforms to said bus access protocol;

specifying design constraints and choice of implementation technology for said electronic device; and generating said technology-dependent design specification by synthesizing said third description according to said design constraints and said choice of implementation technology.

17. A method according to claim 16, wherein said first and second descriptions include descriptions of each of said modules that comprises:

a respective interface circuit for said bus interface that couples to said bus and implements said bus access protocol, a respective data path circuit coupled to said respective interface circuit, one or more respective registers coupled to said respective interface circuit, and a respective state machine coupled to one of said respective registers and coupled to said respective data path circuit so as to control said respective data path circuit, and wherein either said first description or one of said second descriptions describes a module that comprises an external interface circuit coupled to said respective data path circuit and coupled to one or more electrical connections that is accessible from outside said electronic device.

18. A method according to claim 17, wherein said third description describes said bus as comprising an input (I/O) bus and one or more data buses that are substantially independent of one another, and wherein said first and second descriptions describe said modules as each having a respective bus interface circuit comprising a respective I/O interface circuit coupled to said I/O bus and a respective data interface circuit coupled to said one or more data buses.

19. A method according to claim 18, wherein said third description describes said I/O bus as comprising an I/O read bus and an I/O write bus, and wherein said first and second descriptions describe said modules as each having respective I/O interface circuits coupled to said I/O read bus using tri-state connections.

20. A method according to claim 18, wherein said third description describes said I/O bus as comprising an I/O write bus and a plurality of I/O read buses, and wherein either said first description or one of said second descriptions describes a respective module having said respective interface circuit comprising a multiplex circuit coupled to said plurality of I/O read buses.

21. A method according to claim 18, wherein said third description comprises a description of a data bus arbitration module having an interface circuit coupled to said I/O bus and having logic that arbitrates requests to access said one or more data buses, wherein said bus arbitration module is programmable by signals received from said I/O bus to arbitrate said requests according to one or more arbitration techniques.

22. A method according to claim 18, wherein said third description describes a plurality of data buses, at least one data interface circuit that is adapted to receive data from two or more of said data buses, and at least one data interface circuit that is adapted to send data to two or more of said data buses.

23. A method according to claim 18, wherein said first description and said second descriptions collectively describe at least one respective data interface circuit that only receives data from said one or more data buses and at least one interface circuit that only sends data to said one or more data buses.

24. A method according to claim 17, wherein said first description and said second descriptions collectively describe at least one module having said respective data path circuit comprising logic that modifies data received from or sent to said respective interface circuit.

25. A method according to claim 24, wherein said at least one module has a respective external interface circuit coupled to said respective data path circuit and coupled to one or more of said electrical connections.

26. A method according to claim 16 that comprises placing cells or gates such that each of said modules is implemented by said cells or gates that predominantly are contiguous with one another.

27. A medium readable by a machine conveying a program of instructions describing an electronic device for interpretation by said machine to generate a technology-dependent design specification for said electronic device, said program of instructions describing said electronic device as comprising:
(a) a bus comprising a plurality of conductive paths internal to said device,
(b) a first module that has
a first bus interface circuit coupled to said bus that operates according to a bus-access protocol,
a first data path circuit coupled to said first bus interface circuit,
one or more first registers coupled to said first bus interface circuit,
a first state machine coupled to one of said first registers and coupled to said first data path circuit so as to control said first data path circuit, and
a first external interface circuit coupled to said first data path circuit and coupled to one or more of electrical connections external to said device, and
(c) one or more second modules each having
a respective second bus interface circuit coupled to said bus that operates according to said bus-access protocol,
a respective second data path circuit coupled to said respective second bus interface circuit,
one or more respective second registers coupled to said respective second bus interface circuit, and
a respective second state machine coupled to one of said respective second registers and coupled to said respective second data path circuit so as to control said respective second data path circuit.

28. A medium according to claim 27, wherein said program of instructions describe a portion of said plurality of conductive paths forming an input/output (I/O) bus and a portion of said plurality of conductive paths forming a first data bus, for said first module said program of instructions describe:
said first interface circuit comprising a first I/O interface circuit coupled to said I/O bus and a first data interface circuit coupled to said first data bus, said first I/O interface circuit operating according to an I/O-bus-access protocol and said first data interface circuit operating according to a data-bus-access protocol,
said first data path circuit coupled to said first data interface circuit, and
said one or more first registers coupled to said first I/O interface circuit, and for each of said second modules said program of instructions describe:
said respective second interface circuit comprising a respective second I/O interface circuit coupled to said I/O bus and a respective second data interface circuit coupled to said first data bus, said respective second I/O interface circuit operating according to said I/O-bus-access protocol and said respective second data interface circuit operating according to said data-bus-access protocol,
said respective second data path circuit coupled to said respective second data interface circuit, and
said one or more respective second registers coupled to said respective second I/O interface circuit.

29. A medium according to claim 28, wherein said program of instructions describe said I/O bus comprising an I/O write bus and a plurality of I/O read buses, said I/O write bus carrying signals from said first module to said second modules, each of said I/O read buses coupled to said second I/O interface circuit in a respective second module to carry signals from said respective second module to said first module, wherein said first I/O interface circuit comprises a multiplex circuit coupled to said plurality of I/O read buses.

30. A medium according to claim 28, wherein said program of instructions describe a plurality of said second modules, wherein said first data bus consists of a plurality of second data buses that are substantially independent of one another, and wherein each of said second data buses is coupled to said first data interface circuit and to at least one of said respective second data interface circuits.

31. A medium according to claim 30, wherein said program of instructions describe a data bus arbitration module coupled to said first module and coupled to each of said second modules to receive requests for access to said second data buses and to send approval for said requests, wherein said bus arbitration module is coupled to said I/O bus and is programmable by signals received from said I/O bus to arbitrate said requests according to one or more arbitration techniques.

32. A medium according to claim 30, wherein said program of instructions describe a plurality of said second modules, wherein at least one of said respective second data interface circuits is adapted to receive data from two or more of said second data buses and at least one of said respective data interface circuits is adapted to send data to two or more said second data buses.

33. A medium according to claim 28, wherein said program of instructions describe a plurality of said second modules, and describe a data bus arbitration module coupled to said first module and coupled to each of said second modules to receive requests for access to said first data bus and to send approval for said requests, wherein said bus arbitration module is coupled to said I/O bus and is programmable by signals received from said I/O bus to arbitrate said requests according to one or more arbitration techniques.

34. A medium according to claim 27, wherein program of instructions describe said first module and each of said second modules in terms that can be implemented by cells or gates that predominantly are contiguous with one another.

* * * * *

UNITED STATES PATENT AND TRADEMARK OFFICE
CERTIFICATE OF CORRECTION

PATENT NO.   : 6,195,593 B1  
DATED        : February 27, 2001  
INVENTOR(S)  : Son Ngoc Nguyen Page 1 of 1

It is certified that error appears in the above-identified patent and that said Letters Patent is hereby corrected as shown below:

<u>Column 29,</u>  
Line 8, after "device" change "," to -- ; --.  
Line 21, after "device" change "," to -- ; --.

Signed and Sealed this

Eighth Day of January, 2002

Attest:

Attesting Officer

JAMES E. ROGAN  
*Director of the United States Patent and Trademark Office*